United States Patent
Lee et al.

(10) Patent No.: US 8,688,877 B1
(45) Date of Patent: *Apr. 1, 2014

(54) MULTIPORT MEMORY ARCHITECTURE

(71) Applicant: Marvell World Trade Ltd., St. Michael (BB)

(72) Inventors: Winston Lee, Palo Alto, CA (US); Sehat Sutardja, Los Altos Hills, CA (US); Donald Pannell, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/716,481

(22) Filed: Dec. 17, 2012

Related U.S. Application Data

(60) Continuation of application No. 12/494,076, filed on Jun. 29, 2009, now Pat. No. 8,335,878, which is a division of application No. 10/702,744, filed on Nov. 5, 2003, now Pat. No. 7,571,287.

(60) Provisional application No. 60/454,443, filed on Mar. 13, 2003.

(51) Int. Cl.
  *G06F 7/00* (2006.01)
  *G06F 13/00* (2006.01)

(52) U.S. Cl.
  USPC ............................................ 710/71; 711/149

(58) Field of Classification Search
  USPC .......................................................... 710/71
  See application file for complete search history.

(56) References Cited

U.S. PATENT DOCUMENTS

| | | |
|---|---|---|
| 4,611,299 A | 9/1986 | Hori et al. |
| 4,823,340 A | 4/1989 | Grassman et al. |
| 5,260,905 A | 11/1993 | Mori |
| 5,307,343 A | 4/1994 | Bostica et al. |
| 5,440,523 A | 8/1995 | Joffe |
| 5,680,595 A | 10/1997 | Thomann et al. |
| 5,719,890 A | 2/1998 | Thomman et al. |
| 5,778,007 A | 7/1998 | Thomann et al. |
| 5,802,131 A | 9/1998 | Morzano |
| 5,815,447 A | 9/1998 | Thomann |

(Continued)

FOREIGN PATENT DOCUMENTS

| | | |
|---|---|---|
| FR | 2779843 | 12/1999 |
| JP | 1162294 | 6/1989 |

(Continued)

OTHER PUBLICATIONS

"6-Port Fast Ethernet Switch, 88E6060 (Product Overview)", *Link Street*; www.marvell.com; *Marvell Semiconductor, Inc.*; Sunnyvale, CA, (2002), 2 pgs.

(Continued)

*Primary Examiner* — Titus Wong

(57) ABSTRACT

The present disclosure describes techniques and apparatuses for multiport memory architecture. In some aspects serial data is received from a data port and converted to n-bit-wide words of data. The n-bit-wide words of data are then buffered as a k-word-long block of parallel data into a line of a multi-line buffer as a block of k*n bits of data. The block of k*n bits of data is then transmitted to a multiport memory via a write bus effective to write the block of k*n bits of data to the multiport memory.

15 Claims, 12 Drawing Sheets

(56) References Cited

U.S. PATENT DOCUMENTS

| | | | |
|---|---|---|---|
| 5,875,470 | A | 2/1999 | Dreibelbis et al. |
| 5,953,340 | A | 9/1999 | Scott et al. |
| 5,996,051 | A | 11/1999 | Mergard |
| 6,021,086 | A | 2/2000 | Joffe |
| 6,034,957 | A | 3/2000 | Haddock et al. |
| 6,067,301 | A | 5/2000 | Aatresh |
| 6,081,528 | A | 6/2000 | Thomann |
| 6,115,389 | A | 9/2000 | Mahale et al. |
| 6,160,814 | A | 12/2000 | Ren et al. |
| 6,167,491 | A | 12/2000 | McAlpine |
| 6,216,205 | B1 | 4/2001 | Chin et al. |
| 6,230,191 | B1 | 5/2001 | Walker |
| 6,370,624 | B1 | 4/2002 | Ajanovic et al. |
| 6,446,173 | B1 | 9/2002 | Pham |
| 6,487,207 | B1 | 11/2002 | Thomann |
| 6,535,939 | B1 | 3/2003 | Arimilli et al. |
| 6,535,963 | B1 | 3/2003 | Rivers |
| 6,539,488 | B1 | 3/2003 | Tota et al. |
| 6,618,390 | B1 | 9/2003 | Erimli et al. |
| 6,712,704 | B2 | 3/2004 | Eliott |
| 6,714,643 | B1 | 3/2004 | Gargeya et al. |
| 6,732,184 | B1 | 5/2004 | Merchant et al. |
| 6,741,589 | B1 | 5/2004 | Sang et al. |
| 6,785,272 | B1 | 8/2004 | Sugihara |
| 7,039,781 | B2 | 5/2006 | Iwata et al. |
| 7,068,651 | B2 | 6/2006 | Schmidt et al. |
| 7,099,325 | B1 | 8/2006 | Kaniz et al. |
| 7,130,308 | B2 | 10/2006 | Haddock et al. |
| 7,136,953 | B1 | 11/2006 | Bisson et al. |
| 7,149,834 | B2 | 12/2006 | Peters et al. |
| 7,185,132 | B2 | 2/2007 | Tang |
| 7,197,591 | B2 | 3/2007 | Kwa et al. |
| 7,249,270 | B2 | 7/2007 | Mansell et al. |
| 7,329,136 | B2 | 2/2008 | Su et al. |
| 7,334,072 | B1 | 2/2008 | Wright |
| 7,359,997 | B2 | 4/2008 | Ishida et al. |
| 7,447,824 | B2 | 11/2008 | Jabori et al. |
| 7,451,280 | B2 | 11/2008 | Furtek et al. |
| 7,469,311 | B1 | 12/2008 | Tsu et al. |
| 7,478,188 | B2 | 1/2009 | Patton |
| 7,480,757 | B2 | 1/2009 | Atherton et al. |
| 7,480,808 | B2 | 1/2009 | Caruk et al. |
| 7,496,707 | B2 | 2/2009 | Freking et al. |
| 7,536,490 | B2 | 5/2009 | Mao |
| 7,539,809 | B2 | 5/2009 | Juenger |
| 7,571,287 | B2 | 8/2009 | Lee et al. |
| 7,583,600 | B1 | 9/2009 | Schanke et al. |
| 7,606,960 | B2 | 10/2009 | Munguia |
| 7,624,221 | B1 | 11/2009 | Case |
| 7,660,925 | B2 | 2/2010 | Larson et al. |
| 7,685,322 | B2 | 3/2010 | Bhesania et al. |
| 7,689,753 | B2 | 3/2010 | Kwak et al. |
| 7,752,342 | B2 | 7/2010 | Tee et al. |
| 7,949,817 | B1 | 5/2011 | Sakarda |
| 8,205,028 | B1 | 6/2012 | Sakarda |
| 8,234,425 | B1 | 7/2012 | Milner |
| 8,335,878 | B2 | 12/2012 | Lee |
| 2001/0036116 | A1 | 11/2001 | Kubo et al. |
| 2003/0154314 | A1 | 8/2003 | Mason, Jr. et al. |
| 2004/0093389 | A1 | 5/2004 | Mohamed et al. |
| 2004/0193774 | A1 | 9/2004 | Iwata et al. |
| 2004/0202192 | A9 | 10/2004 | Galbi et al. |
| 2005/0008011 | A1 | 1/2005 | Georgiou et al. |
| 2005/0268001 | A1 | 12/2005 | Kimelman et al. |
| 2006/0031628 | A1 | 2/2006 | Sharma |
| 2006/0075144 | A1 | 4/2006 | Challener et al. |
| 2006/0106962 | A1 | 5/2006 | Woodbridge et al. |
| 2007/0002880 | A1 | 1/2007 | Chien et al. |
| 2008/0148083 | A1 | 6/2008 | Pesavento et al. |
| 2008/0215773 | A1 | 9/2008 | Christison et al. |
| 2008/0215774 | A1 | 9/2008 | Kim et al. |
| 2008/0265838 | A1 | 10/2008 | Garg et al. |
| 2008/0320189 | A1 | 12/2008 | Arssov |
| 2009/0200982 | A1 | 8/2009 | Hurtz |

FOREIGN PATENT DOCUMENTS

| | | |
|---|---|---|
| JP | 4061094 | 2/1992 |
| JP | 5047174 | 2/1993 |
| JP | 10506776 | 6/1998 |
| JP | 2004288355 | 10/2004 |
| JP | 5107204 | 10/2012 |

OTHER PUBLICATIONS

"7-Port Fast Ethernet Switch with 802.1 Q, 88E6063 (Product Overview)", www.marvell.com; *Marvell Semiconductor, Inc.*; Sunnyvale, CA, (2002), 2 pgs.

"Advisory Action", U.S. Appl. No. 10/702,744, (Sep. 11, 2007), 3 pages.

"Advisory Action", U.S. Appl. No. 12/163,801, (Jan. 24, 2011), 2 pages.

"European Communication and Search Report", Application No. EP04006012; European Patent Office; Munich, Germany, (May 30, 2005), 4 pgs.

"European Search Report", Application No. EP04006012; Munich, Germany, (May 30, 2005), 4 pages.

"Final Office Action", U.S. Appl. No. 10/702,744, (Jun. 25, 2007), 13 pages.

"Final Office Action", U.S. Appl. No. 12/163,801, (Oct. 14, 2010), 12 pages.

"Final Office Action", U.S. Appl. No. 12/163,801, (Nov. 14, 2011), 12 pages.

"Final Office Action", U.S. Appl. No. 12/182,014, (Oct. 29, 2010), 16 pages.

"Final Office Action", U.S. Appl. No. 12/434,000, (Apr. 26, 2011), 15 pages.

"Final Office Action", U.S. Appl. No. 12/434,000, (Sep. 4, 2012), 17 pages.

"Final Office Action", U.S. Appl. No. 12/494,076, (Mar. 30, 2011), 13 pages.

"Final Office Action", U.S. Appl. No. 12/494,076, (Oct. 3, 2011), 13 pages.

"Final Office Action", U.S. Appl. No. 13/092,734, (Dec. 29, 2011), 6 pages.

"Foreign Notice of Allowance", Japanese Application No. 2008-270813, (Aug. 31, 2012), 7 pages.

"Foreign Office Action", Japanese Application No. 2004-071574, (Feb. 19, 2008), 4 pages.

"Foreign Office Action", Japanese Application No. 2008-270813, (May 26, 2011), 4 pages.

"Foreign Office Action", Japanese Application No. 2008-270813, (Apr. 3, 2012), 6 pages.

"Information Technology—Telecommunications and Information Exchange Between Systems—Local and Metropolitan Area Networks—Specific Requirements", *IEEE*, Wireless LAN Medium Access Control (MAC) and Physical Layer (PHY) Specifications,(Aug. 20, 1999), 531 pages.

"Link Street 88E6063 7-Port Fast Ethernet Switch with QoS, 802.1Q VLAN, and Virtual Cable Tester (VCT) Technology", *Marvell: News*; www.marvell.com; *Marvell Semiconductor, Inc.*; Sunnyvale, CA, (Jul. 14, 2003), 1 page.

"Link Street 88E6181 8-Port Gigabit Ethernet Switch with Four-Level QoS", *Marvell: News*; www.marvell.com; *Marvell Semiconductor, Inc.*; Sunnyvale, CA, (Jul. 14, 2003), 1 page.

"Link Street, Integrated Gateway Router with Multi-Port QoS Switch 88E6218 (Product Overview)", *Gateway Solutions*; www.marvell.com; *Marvell Semiconductor, Inc.*; Sunnyvale, CA, (2003), 2 pgs.

"Link Street, Integrated Gateway Router with Multi-Port Switch, 88E6208 (Product Overview)", *Gateway Solutions*; www.marvell.com; *Marvell Semiconductor, Inc.*; Sunnyvale, CA, (2003), 2 pgs.

"Marvell Link Street Gigabit Ethernet Switches Enable the Rapid Deployment of Gigabit Connectivity for the SOHO Market", *Marvell: Press and Investor News; Marvell Semiconductor, Inc.*; Sunnyvale, CA; http://www.marvell.com/press/pressNewsDisplay.do?releaseID=347, (Apr. 29, 2003), 2 pgs.

"Method and Circuit for Transferring Data with Dynamic Parity Generation and Checking Scheme in Multi-port DRAM",

(56) References Cited

OTHER PUBLICATIONS esp@cenet; Publication No. JP10506776T (Abstract of Corresponding Document No. US5778007); esp@cenet Database—Worldwide; http://v3.espacenet.com/textdoc?DB=EPODOC&IDX=JP10506776T&F=0, (Jun. 30, 1998), 5 pages.
"Multiport Component Memory Series and Application with a Computer", *Automated Translation; Europaisches Patentamt*, European Patent Office, Office European Des Brevets; Description of FR2779843; *World Lingo Language Translation Services*; www.worldlingo.com, (Nov. 19, 2007), 15 pgs.
"Non-Final Office Action", U.S. Appl. No. 12/182,014, (Jun. 1, 2010), 13 pages.
"Non-Final Office Action", U.S. Appl. No. 10/702,744, (Feb. 19, 2009), 5 pages.
"Non-Final Office Action", U.S. Appl. No. 10/702,744, (Dec. 27, 2006), 10 pages.
"Non-Final Office Action", U.S. Appl. No. 12/163,801, (Apr. 22, 2010), 10 pages.
"Non-Final Office Action", U.S. Appl. No. 12/163,801, (Jul. 20, 2011), 11 pages.
"Non-Final Office Action", U.S. Appl. No. 12/434,000, (Mar. 14, 2013), 18 pages.
"Non-Final Office Action", U.S. Appl. No. 12/434,000, (Nov. 10, 2010), 9 pages.
"Non-Final Office Action", U.S. Appl. No. 12/434,000, (May 4, 2012), 15 pages.
"Non-Final Office Action", U.S. Appl. No. 12/436,577, (Sep. 29, 2010), 6 pages.
"Non-Final Office Action", U.S. Appl. No. 12/494,076, (Dec. 22, 2010), 12 pages.
"Non-Final Office Action", U.S. Appl. No. 13/092,734, (Aug. 24, 2011), 15 pages.
"Notice of Allowance", U.S. Appl. No. 10/702,744, (Mar. 27, 2009), 7 pages.
"Notice of Allowance", U.S. Appl. No. 12/163,801, (Mar. 22, 2012), 6 pages.
"Notice of Allowance", U.S. Appl. No. 12/182,014, (Jan. 20, 2011), 6 pages.
"Notice of Allowance", U.S. Appl. No. 12/436,577, (Apr. 14, 2011), 4 pages.
"Notice of Allowance", U.S. Appl. No. 12/494,076, (Aug. 2, 2012), 8 pages.
"Notice of Allowance", U.S. Appl. No. 13/092,734, (Feb. 23, 2012), 4 pages.
"Partial European Search Report", Application No. EP04006012; European Patent Office, Munich, Germany, (Mar. 14, 2005), 2 pgs.
"Restriction Requirement", U.S. Appl. No. 10/702,744, (Jun. 30, 2006), 5 pages.
Litaize, Daniel et al., "Serial Multi Port Memory Component Comprising RAM Memory Bank Assemblies for Use in Computer", Abstract of FR2779843; Publication No. FR2779843; esp@cenet database; http://v3.espace.com/textdoc?DB=EPODOC&IDX=FR2779843&F=0, (Dec. 12, 1999), 1 page.
Mori, Toshiki "Multiport Memory", English Abstract of Japanese Patent Publication No. JP5047174; esp@cenet database—Worldwide, (Feb. 26, 1993), 1 page.
Pallampati, Amarnath "iSCSI Performance Over RDMA-Enabled Network", *Thesis, Department of Electrical and Computer Engineering*, Graduate School of Wichita State University., (Jul. 2006), 58 pages.
Prince, Betty "High Performance Memories, New Architectures DRAMs and SRAMs—Evolution and Function", *John Wiley & Sons, Ltd.*; West Sussex, England, (1996), pp. 58-61.
"Non-Final Office Action", U.S. Appl. No. 13/045,186, Aug. 22, 2013, 12 pages.
"Restriction Requirement", U.S. Appl. No. 13/045,186, Jun. 19, 2013, 5 pages.
"Notice of Allowance", U.S. Appl. No. 12/434,000, Oct. 17, 2013, 9 pages.
"Notice of Allowance", U.S. Appl. No. 13/045,186, Nov. 1, 2013, 9 pages.

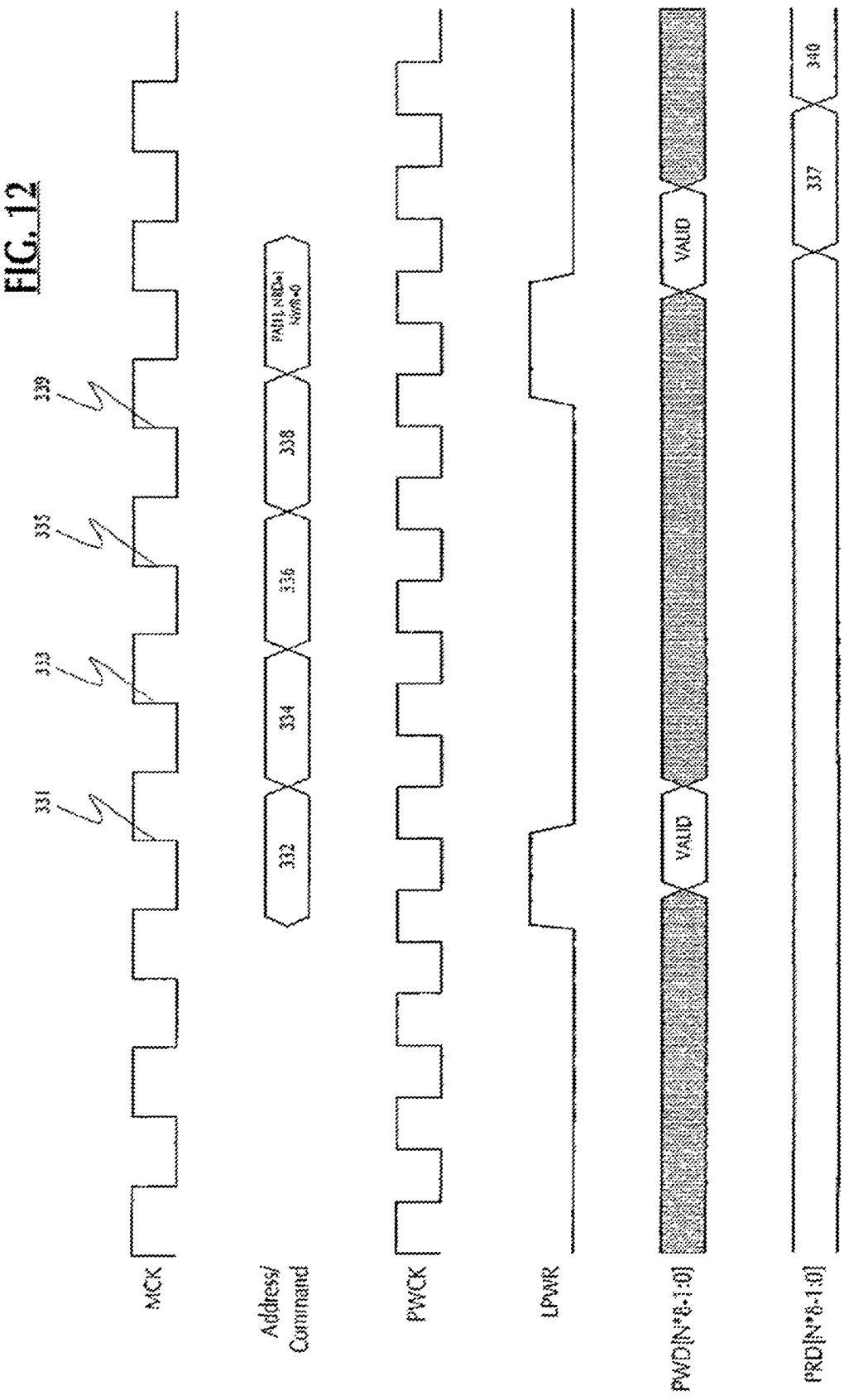

MULTIPORT MEMORY ARCHITECTURE

RELATED APPLICATION

This present disclosure is a continuation of U.S. application Ser. No. 12/494,076, filed on Jun. 29, 2009, which is a divisional of and claims priority to U.S. Utility application Ser. No. 10/702,744, filed on Nov. 5, 2003 which in turn claims priority to U.S. Provisional Patent Application Ser. No. 60/454,443, filed on Mar. 13, 2003, the disclosure of which are incorporated by reference herein in their entirety.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Memories are used in networks to enable rapid data transfer from one or more data sources to any of a plurality of destinations, oftentimes in switching devices. FIG. 1 shows a conventional multiport memory architecture 10 comprising a memory array 20, ports 30-37, first-in-first-out memory (FIFO) buffers 40-47 and multiplexer 54. Each of ports 30-37 receives serial data from a network (e.g., an Ethernet device) and converts it into m-bit wide parallel data. In one example, m is 8. This m-bit wide parallel data is temporarily placed in a corresponding FIFO buffer 40-47, which also functions as a time domain change buffer, before it is stored in memory array 20. Memory array 20 has a write port 22 and a read port 24, through which data is transferred to and from storage elements in the array 20, respectively. Each of FIFO buffers 40-47 can interact independently with memory array 20 due to the write bus 50 and the read bus 52 surrounding memory array 20. Each FIFO buffer 40-47 is also configured to convert serial data to parallel data; in one example, it converts byte serial data to byte parallel data. Since each FIFO buffer 40-47 has its own dedicated write bus to memory 20, write bus 50 is from (m*n) to (8m*n) bits wide, thereby accommodating each of the m*n-bit wide busses enabling one of buffers 40-47 to communicate with memory array 20. Since memory input port 22 is also m*n bits wide, multiplexer 50 selects one of the dedicated FIFO-to-memory write busses for writing data from the FIFO into memory 20. Read bus 52 outputs m*n-bit wide data from memory 20 to all of FIFO buffers 40-47. A multi-bit control signal communicated to all of FIFO buffers 40-47 determines which of FIFO buffers 40-47 writes data into its memory cells for subsequent external transmission through a corresponding port 30-37.

Ports 30-37 typically operate at network speeds; e.g., at or about 1 GHz. However, memory array 20 typically operates at a significantly slower speed; e.g., 100-200 MHz. Consequently, the architecture 10 requires FIFO buffers to temporarily store the data that is going into or coming out of memory array 20. However, FIFO buffers 40-47 are typically located close to ports 30-37, which limits the effective operational rate of FIFO buffers 40-47 and memory array 20 due to the loading requirements of busses 50 and 52 (e.g., the current and/or voltage needed to overcome or control the inherent capacitance[s], resistance[s] and/or impedance of busses 50 and 52). Thus, to improve throughput using the architecture of FIG. 1, one must either increase memory speed or bandwidth (i.e., the width of the busses carrying data to and from memory array 20).

There are physical limits to the maximum throughput of architecture 10, however. Memory can only go so fast in any given process technology, and increasing the width of the memory limits its speed due to internal loading of the memory's control signals. Increasing the external width of a memory causes increased die area and die cost. In the example of FIG. 1, when all ports 30-37 operate at 1 Gbit/second and m is 8, the 8-bit bytes of data are received by FIFOs 40-47 at a rate of 125 MHz. The data is full duplex, thereby requiring 8 bits of data to be processed in each direction at a rate of 125 MHz for every port. As a result, memory 20 must be able to process (8 ports*8 bits*2 directions)=128 bits of data per cycle at a 125 MHz rate. In a 24-port architecture, memory 20 must be able to process 384 bits of data at rate of 125 MHz. Since limits on memory speed and/or memory bus dimensions (width and/or length) limit the throughput of the standard memory array 20, alternative approaches are desired.

A need therefore exists to increase the operational speed of multiport memories to keep up with ever-increasing demands for increased network speeds and high network switching flexibility.

SUMMARY

Aspects of the present disclosure relate to multiport memory architectures, systems and methods for using the same. The multiport memory architecture generally comprises (a) a memory array; (b) a plurality of ports configured to receive and/or transmit data; and (c) a plurality of port buffers, each of which is configured to transmit the data to and/or receive the data from one or more of the ports, and all of which are configured to (i) transmit the data to the memory array on a first common bus and (ii) receive the data from the memory array on a second common bus. The systems and network switches generally comprise those that include an architecture embodying one or more of the inventive concepts disclosed herein.

The method of writing generally comprises the steps of (1) converting serial data to n-bit-wide parallel data, n bits of data forming a word; (2) buffering a k-word-long block of the n-bit-wide parallel data; and (3) substantially simultaneously writing the k*n bits of data into the memory. Aspects of the disclosure also relate to a method of reading data from a memory, comprising the steps of (1') substantially simultaneously outputting k*n bits of data from the memory onto a k*n-bit-wide bus; (2') converting the k*n bits of data into n-bit-wide parallel data; and (3') converting the n-bit-wide parallel data into serial data to be read externally from the memory. Aspects of the disclosure also concern a method of transferring data in a network, comprising a combination of one or more steps from each of the present methods of writing to and reading from a memory.

Aspects of the present disclosure advantageously reduce latency in data communications, particularly in packet network switches, by tightly coupling the port buffers to the main memory, thereby advantageously enabling (1) use of point-to-point communications over relatively long segments of the memory read and write paths and (2) the elimination of a FIFO memory in the memory read and write paths. Thus, the techniques and apparatuses described herein also provide generally reduced routing congestion and reduced die sizes, particularly when using standard cell-based design techniques. On-chip point-to-point communications from bond pad to port buffers and vice versa further reduces parasitics in the corresponding wires. By tightly coupling port buffers to the main memory array, RC components of the memory read and write busses are reduced, further increasing data transmission rates and throughput. In contrast, the routing of the architecture of FIG. 1 is relatively complex and consumes a greater chip area.

These and other advantages of the present disclosure will become readily apparent from the detailed description of preferred aspects below.

BRIEF DESCRIPTION OF THE DRAWINGS

FIG. 12 is a timing diagram for exemplary parallel write and read register operations according to one or more aspects.

DETAILED DESCRIPTION

Figure 1:
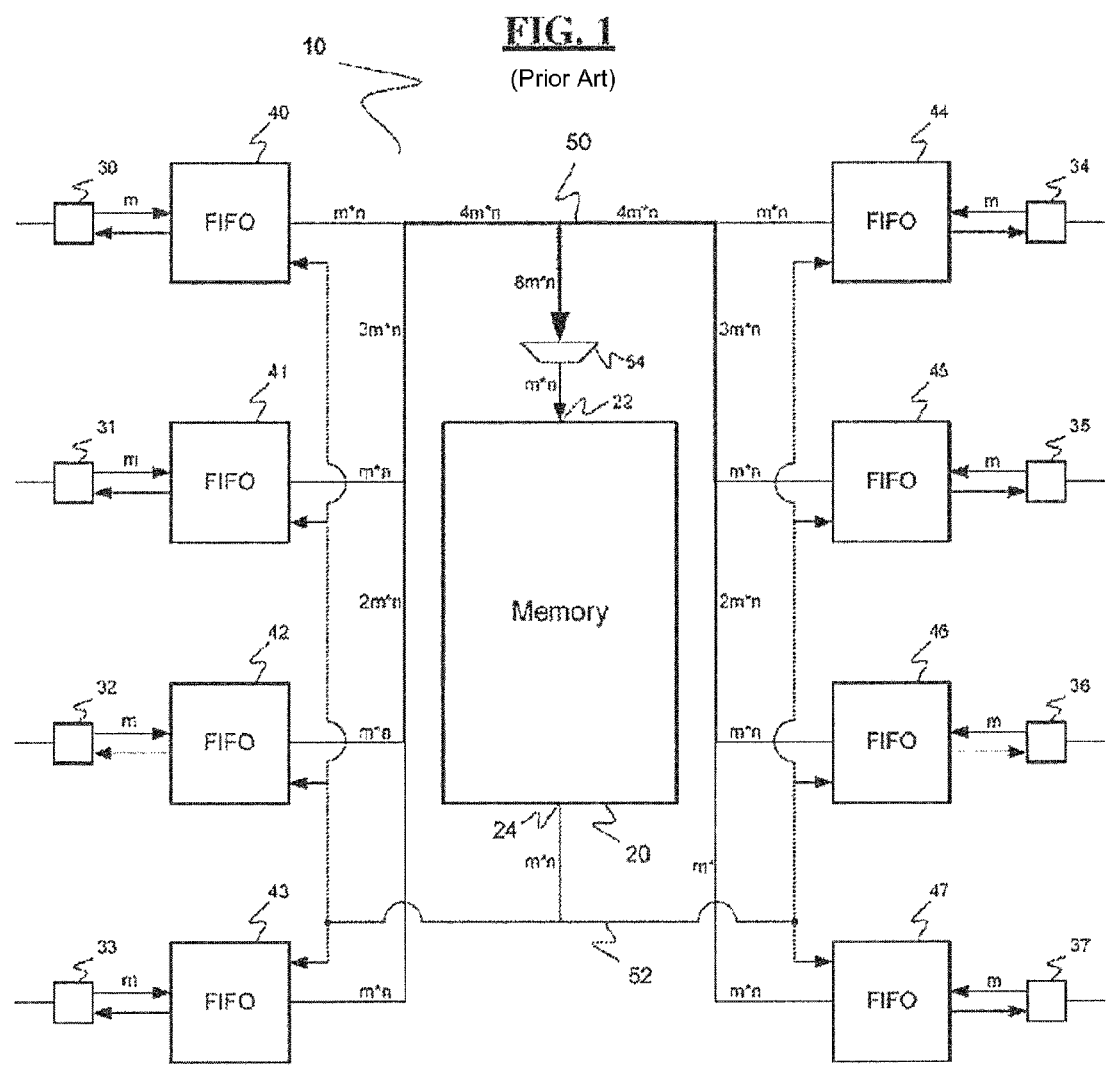
FIG. 1 is a diagram showing a conventional multiport memory architecture.

Reference will now be made in detail to various aspects of the disclosure, examples of which are illustrated in the accompanying drawings. While these aspects will be described in conjunction with various implementations, it will be understood that they are not intended to limit the disclosure to these aspects. On the contrary, these aspects are intended to cover alternatives, modifications and equivalents, which may be included within the spirit and scope of the disclosure as defined by the appended claims Furthermore, in the following detailed description of various aspects, numerous specific details are set forth in order to provide a thorough understanding of the present disclosure. However, it will be readily apparent to one skilled in the art that aspects of the present disclosure may be practiced without these specific details. In other instances, well-known methods, procedures, components, and circuits have not been described in detail so as not to unnecessarily obscure aspects of the present disclosure.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" may be used somewhat interchangeably herein, but are generally given their art-recognized meanings. Also, for convenience and simplicity, the terms "data," "data stream," "signal," "waveform" and "information" may be used interchangeably, as may the terms "connected to," "coupled with," "coupled to," and "in communication with" (which may refer to a direct or indirect link or signal path), but these terms are also generally given their art-recognized meanings.

The present disclosure concerns a multiport memory architecture, and systems comprising and methods of using the same. The multiport memory architecture generally comprises (a) a memory array; (b) a plurality of ports configured to receive and/or transmit data; and (c) a plurality of port buffers, each of which is configured to transmit the data to and/or receive the data from one or more of the ports, and all of which are configured to (i) transmit the data to the memory array on a first common bus and (ii) receive the data from the memory array on a second common bus. A further aspect of the disclosure concerns a network switch, system, and network generally comprising the present architecture and/or embodying one or more of the inventive concepts described herein.

Even further aspects of the disclosure concern methods of reading from and/or writing to a memory. The method of writing generally comprises the steps of (1) converting serial data to n-bit-wide parallel data, n bits of data forming a word; (2) buffering a k-word-long block of the n-bit-wide parallel data; and (3) substantially simultaneously writing the k*n bits of data into the memory. The disclosure also relates to method of reading data from a memory, comprising the steps of (1') substantially simultaneously outputting k*n bits of data from the memory onto a k*n-bit-wide bus; (2') converting the k*n bits of data into n-bit-wide parallel data; and (3') converting the n-bit-wide parallel data into serial data to be read externally from the memory. The disclosure also concerns a method of transferring data in a network, comprising a combination of one or more steps from each of the present methods of writing to and reading from a memory.

The disclosure, in its various aspects, will be explained in greater detail below with regard to exemplary aspects.

An Exemplary Memory Architecture

One aspect relates to a multiport memory architecture generally comprises (a) a memory array; (b) a plurality of ports configured to receive and/or transmit data; and (c) a plurality of port buffers, each of which is configured to transmit data to and/or receive data from one or more of the ports, and all of which are configured to (i) transmit block of the data to the memory array on a first common bus and (ii) receive a block of the data from the memory array on a second common bus.

Figure 2:
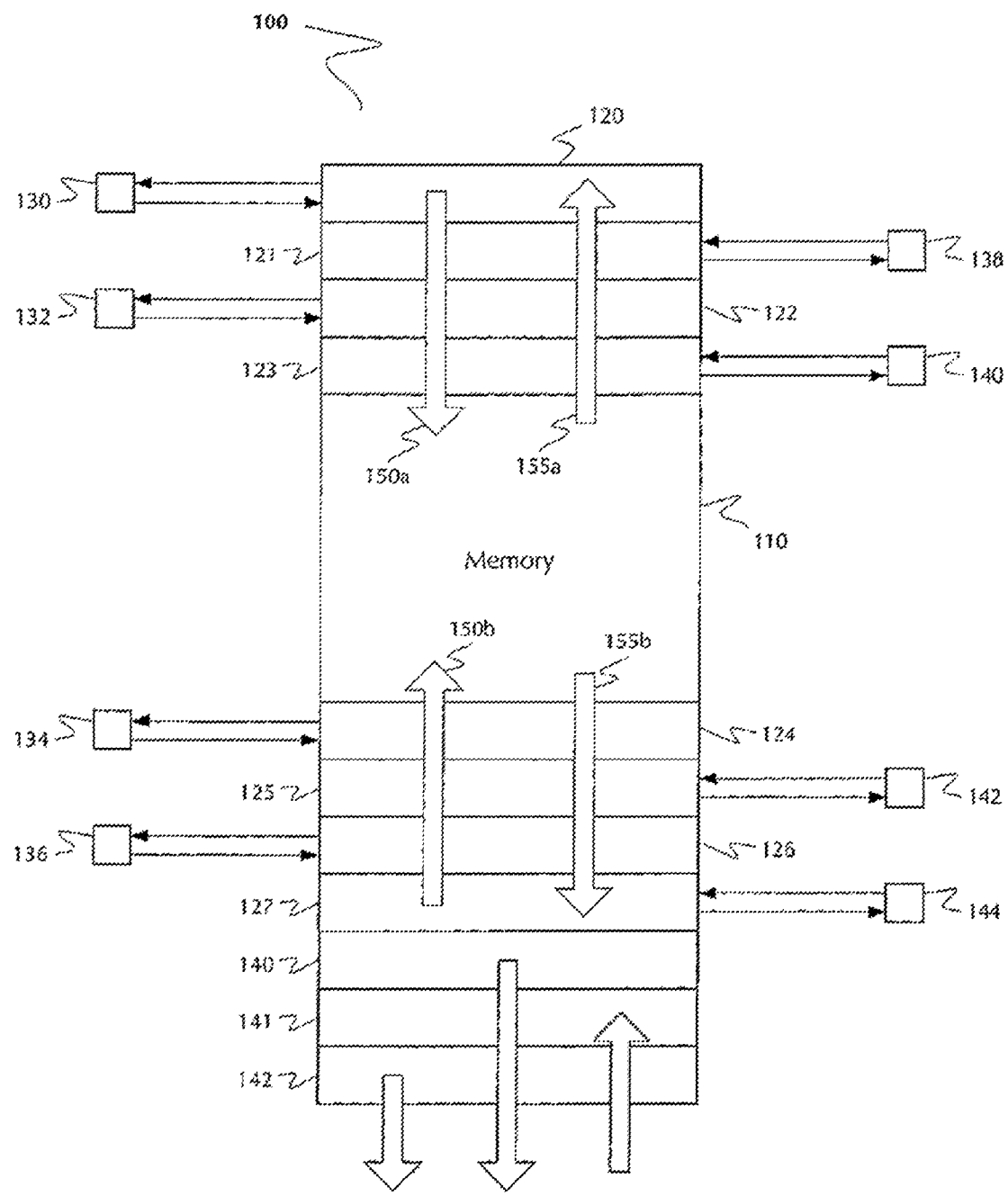
FIG. 2 is a diagram showing an implementation of the present multiport memory architecture.

FIG. 2 shows a first exemplary implementation 100 of the present multiport memory architecture, including memory array 110, port buffers 120-127, ports 130-144, parallel read and write registers 141-142 and "snoop" register 140. Conspicuous by their absence are the FIFO memories from FIG. 1. Port buffers 120-127 generally comprise one or more registers, or banks of flip-flops, latches, or registers, configured to receive parallel data from and provide parallel data to a port and memory array 110. Data is communicated between port buffers 120-127 and memory array 110 on common memory write busses 150a and 150b, and on common memory read busses 155a and 155b.

In the present architecture, the memory array is conventional, and may comprise a plurality of memory sub-arrays. These sub-arrays may comprise one or more rows, columns, blocks or pages of memory, pages being a preferred implementation (a so-called "multiport page mode memory," or MPPM). Each of the memory rows, columns, blocks and/or pages may be identifiable and/or accessible by a unique memory address corresponding to the row, column, block and/or page. In a preferred implementation, each of the blocks of data transferred between memory array 110 and a port buffer 120-127 comprises a page of data. Typically, the minimum density of the memory array 110 is 256 kb or 1 Mb. While the maximum density of the memory array 110 is not limited, as a practical matter, a typical maximum density is about 32 Mb or 128 Mb.

The nature of the memory elements in memory array 110 is also not particularly limited, and may include latches, static random access memory (SRAM), dynamic random access memory (DRAM), magnetic random access memory (MRAM), electrically erasable and programmable read only memory (EEPROM) and flash memory, although for simplicity, speed and low power considerations, latches are preferred. The memory array 110 may also be synchronous or asynchronous, but for speed and timing considerations, synchronous memory is preferred.

In the present architecture, the port buffers 120-127 may be considered "tightly coupled" to the memory array 110. In essence, "tightly coupled" means that the port buffers 120-127 are in closer proximity to the memory array 110 than they are to ports 130-145, and that the memory busses 150a, 150b, 155a and 155b are designed to reduce or minimize RC components, such as bus length (corresponding to resistance) and/or parasitic capacitance between adjacent metal lines in the bus. While the port buffers 120-127 are shown on different sides of memory array 110, and the ports 130-144 are shown on different sides of port buffers 120-127, and the port buffers 120-127 can be located on one side of array 110 (see, e.g., FIG. 3), and the ports 130-144 can be located on one side of the port buffers 120-127. Furthermore, communications between port buffers 120-127 and memory array 110 are preferably not delayed by clocked circuit elements (other than, e.g., latches and/or registers in the port buffers themselves or memory array itself) in a port buffer that is "tightly coupled" to a memory array.

In the present multiport memory architecture, the number of port buffers may be any integer of 2 or more, 3 or more, or 4 or more. In certain implementations, there may be ($2^x$–d) port buffers in the architecture, x being an integer of at least 3, and in various aspects, of from 4 to 8 (e.g., 5 or 6), and d is 0 or an integer of ($2^{x-1}$–1) or less. The value of d may be determined by the number of parallel registers that accompany the port buffers (e.g., that have a port buffer address), but which provide a different function, such as "snoop" register 140 and/or parallel read and write registers 141-142. Independently, the number of corresponding ports is generally 2 or more, 3 or more, or 4 or more, and in certain implementations, may be ($2^x$–d), where x and d are as described above. In one implementation, there are 10 ports. Preferably, the ports and port buffers are in a 1:1 relationship, although it is not necessarily the case that each port communicates with only a single port buffer (or vice versa; a so-called "dedicated" port or port buffer).

Figure 4:
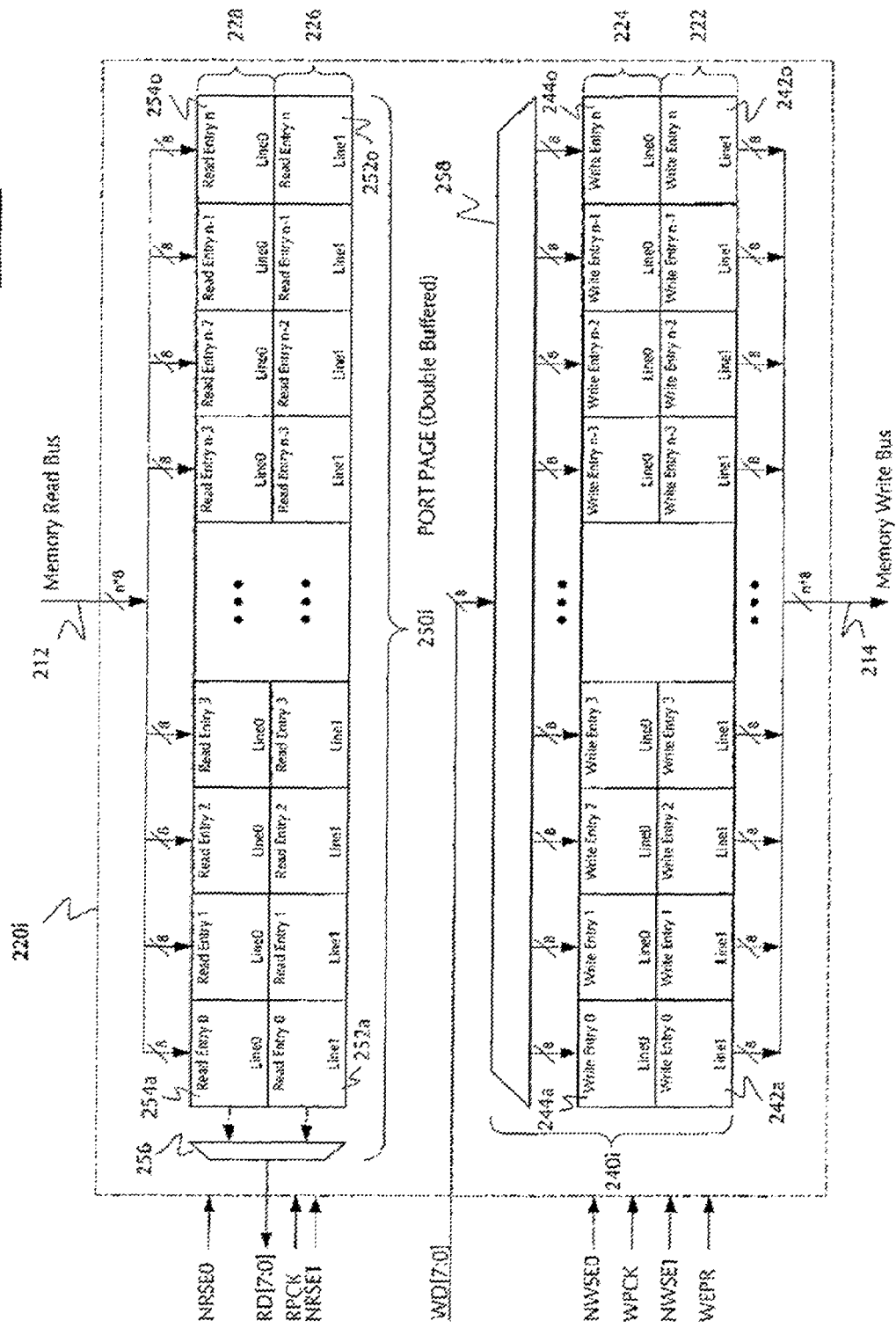
FIG. 4 is a block diagram of an exemplary double buffered port buffer.

Referring now to FIG. 4, the port buffer may comprise a read portion 250i and a write portion 240i. Each of the read portion 250i and the write portion 240i may comprise a plurality of entries 242a-242o, 244a-244o, 252a-252o, and 254a-254o, each of which in turn may comprise one or more data storage units. A data storage unit is a conventional memory cell configured to store one bit of data, and may comprise an SRAM cell, a DRAM cell, a MRAM cell, an EEPROM cell and/or a flash memory cell, although for speed and low power considerations, SRAM is preferred.

In preferred implementations, the read portion 250i and the write portion 240i each independently comprises a*($2^y$+b) entries, where a is the number of lines or rows of entries (e.g., write lines 242 and/or 244), $2^y$ is the number of entries in a line or row, y is an integer of at least 3, and b is 0 or an integer of ($2^y$–1) or less. In some aspects, b is 0 and y is an integer of from 4 to 8, and in specific aspects, y is 5 or 6.

Referring back to FIG. 2, the memory read and write busses 150a, 150b, 155a and 155b in the present architecture may each have a width of k*n bits, where k is the number of entries in a port buffer line or row, and n is the number of data bits in an entry. As described above, k may be ($2^y$+b), where y and b are also as described above. Thus, the common memory busses may have a width of n*($2^y$+b) bits. In certain implementations, n is ($2^p$+c), where p is an integer of from 2 to 7 (e.g., from 3 to 6), and c is 0 or an integer of ($2^p$–1) or less. In one implementation, c is 0. This effectively enables entire blocks of data (where a block of data is that data in a port buffer line 222, 224, 226 or 228, as shown in FIG. 4) to be written to or read from memory array 110 substantially simultaneously. In preferred aspects, n is also the width of a bus configured to communicate data between a port and its corresponding port buffer. Such a bus may comprise two separate unidirectional busses (e.g., the m-bit-wide busses in FIG. 1).

Again referring back to FIG. 2, memory read and write busses 150a, 150b, 155a and 155b may be considered "common" busses, as they are common to a plurality of port buffers and have a constant bit width along their entire lengths. For example, port buffers 120-123 each have the same number of outputs onto memory write bus 150a and the same number of inputs from memory read bus 155a. As a result, data read from memory array 110 onto memory read bus 155a can be latched into any one (or even all) of port buffers 120-123.

The port buffers in the present architecture may be single buffered (see, e.g., FIG. 5), in which case the read portion comprises a first read line and the write portion comprises a first write line, or multi-buffered (see, e.g., the double-buffered implementation 220*i* of FIG. 4), in which case the read portion comprises a plurality of read lines and the write portion comprises a plurality of write lines. For example, a double-buffered configuration comprises first and second read lines and first and second write lines; a triple-buffered configuration comprises first, second and third read lines and first, second and third write lines; a quadruple-buffered configuration comprises first, second, third and fourth read lines and first, second, third and fourth write lines; etc. In either configuration, the write portion may further comprise (i) a demultiplexer 258 configured to select one of the entries (e.g., 244*a*-244*o*) for storing data from a corresponding port, and/or (ii) one or more control signals configured to select one of the write lines for transferring data from the port buffer to the memory array. Referring now only to FIG. 4, in the multi-buffered configuration (e.g., double buffered port buffer 220*i*), the read portion may further comprise a multiplexer 256 and/or one or more control signals configured to select one of the read lines for outputting data to the corresponding port.

The present architecture enables processing and/or transfers of data at a variety of rates and/or across time domains. For example, the memory array may operate at a first frequency, and each of the ports may operate independently at a second frequency greater or less than the first frequency. For example, and referring back to FIG. 2, a receiver or transmitter in a port 130-144 may receive or transmit data at a rate of about 10 MHz, 100 MHz, 1 GHz, about 2 GHz, or about 3.125 GHz. Also, each port may operate at a frequency independent of the other ports' operating frequencies. However, the memory array 110 and port buffers 120-127 generally operate at a frequency of from 100 MHz to 400 MHz, although port buffers 120-127 do not necessarily operate at the same frequency as memory array 110. Furthermore, while memory array 110 and port buffers 120-127 may operate synchronously with respect to one another, each of ports 130-144 operate asynchronously with respect to (i) memory array 110 and port buffers 120-127 and (ii) the other ports. Thus, the port buffers 120-127 function independently as time domain buffers (or switches) between each of the port domains and the memory domain.

Continuing to refer to FIG. 2, in further aspects, the present memory architecture further includes (i) a parallel read register 140 and a parallel write register 141, and/or (ii) a read-only "snoop" register 142. Parallel read register 140 is a redundant register for port buffer read registers (e.g., port buffer read portion 250*i* in FIG. 4). As is known to those skilled in the art, a redundant read register can replace a primary read register when the primary read register has a hardware defect, usually by substituting the redundant read register address for the primary read register address or by rewiring the busses to and from the primary read register (typically by cutting fuses). The redundant read register can temporarily store a copy of the data in a primary read register in order to replace the data quickly, should a processing error occur downstream from the primary read register. Thus, parallel read register 140 (FIG. 2) has a structure generally similar to or the same as port buffer read portion 250*i* (FIG. 4). Similarly, parallel write register 141 (FIG. 2) is a redundant write register for port buffer write register (e.g., port buffer read portion 240*i* in FIG. 4), and generally has a structure and functionality similar thereto. The parallel read and write registers 140-141 can serve ports or data processing elements that can benefit from greater bandwidth than that attained using the standard ports (i.e., buffered by a standard port buffer 120-127), since the data width of parallel read and write registers 140-141 can be the full width of the memory array 110. The parallel read and write registers 140-141 can also be used for fast access to the memory during BIST (built in self test) of the memory.

Read-only "snoop" register 142 (FIG. 2) is configured to store a copy of data to be written into main memory (e.g., memory 110). Snoop register 142 may further include processing logic, or be connected to external processing logic, for certain processing operations, such as packet or frame header processing logic (e.g., destination address, source address, frame type, etc.), so that subsequent modifications to the data and/or switching decisions in a network containing the memory can be made. Additional logic for executing such modifications and/or transfers may be located elsewhere in an IC containing the present multiport memory, or it may be located in a coprocessor IC proximate thereto (e.g., on a common substrate or printed circuit board). Thus, snoop register 142 effectively saves multiport memory 100 from having multiple sets of processing logic, one for each port buffer, which would be required in applications involving packet or frame processing in the absence of a dedicated and/or redundant register for such operations.

An Exemplary Packet Network Switch, System, and Network

In a further aspect, the network switch, system, and network generally comprise those that include an architecture embodying one or more of the inventive concepts disclosed herein. For example, the network switch may simply comprise the present multiport memory architecture. In preferred aspects, the network switch is embodied on a single integrated circuit.

As discussed above, one advantage of the aspects described herein is that a FIFO buffer to buffer data between a port and main memory is not necessary, thereby reducing the area of an IC dedicated to FIFO-main memory routing and (ideally) increasing data transmission speeds though the IC. Therefore, the present network switch may comprise a plurality of port buffers that each (i) transmit the data to a corresponding port along a first data path and (ii) receive the data from the corresponding port along a second data path, wherein none of these data paths includes a first-in-first-out (FIFO) memory.

In further aspects, the system may include a port that is configured to convert serial data from the network to parallel data for processing in the network switch, and/or convert parallel data from the network switch to serial data for the network. In most implementations, the system port will be the memory architecture port described above, but in some implementations, the system port can be a separate port configured to transmit data externally to an integrated circuit (IC) that includes the memory architecture and a transmitter. Thus, the system may further include (i) at least one port (and preferably a plurality of ports) comprising a transmitter configured to transmit serial data to an external receiver; and (ii) at least one port (and preferably a plurality of ports) comprising a receiver configured to receive externally-generated serial data (e.g., serial data from an external transmitter).

The aspects further relate to a network, comprising at least one of the present systems, and a plurality of storage or data communications devices, each of the devices being communicatively coupled to the system. In further aspects, the network may comprise (a) a plurality of the present systems, which may be communicatively coupled to each other and/or cascaded with each other; and (b) a plurality of storage or communications devices, wherein each storage or communications device is communicatively coupled to at least one of the systems. In one implementation, each of the devices is communicatively coupled to a unique system. The network may be any kind of known network, such as a packet switching network.

Exemplary Methods

Various aspects described herein relate to method of writing data to a memory, comprising the steps of (a) converting serial data to n-bit-wide parallel data, n bits of data forming a word; (b) buffering a k-word-long block of the n-bit-wide parallel data; and (c) substantially simultaneously writing the k*n bits of data into the memory. The aspects also relate to method of reading data from a memory, comprising the steps of (1) substantially simultaneously outputting k*n bits of data from the memory onto a k*n-bit-wide bus; (2) converting the k*n bits of data into n-bit-wide parallel data; and (3) converting the n-bit-wide parallel data into serial data to be read externally from the memory. The aspects also concern a method of transferring data in a network, comprising combinations of steps in the methods of writing and reading.

In one implementation of the method of writing, buffering may comprise sequentially writing k words of the n-bit-wide parallel data into k data storage elements. In a further aspects of the method(s) of reading and/or writing, the step of converting serial data to n-bit-wide parallel data may be conducted at a first frequency, the buffering step at a second frequency, and the step of substantially simultaneously writing the k*n bits of data at a third frequency, the first frequency being the same as or different from both the second and the third frequencies. As discussed above, the first frequency may be greater or less than the second and third frequencies. However, the third frequency is generally substantially the same as or higher than the second frequency.

The method of writing data may further comprise the step(s) of (i) identifying one of a plurality of buffer addresses for buffering the k-word-long block of the n-bit-wide parallel data, (ii) identifying one of a plurality of memory addresses for substantially simultaneously writing all k*n bits of data into the memory, (iii) receiving the serial data.

The aspects described herein further encompasse a method of transferring data in a network, comprising: the present method of writing data to a memory, and substantially simultaneously reading the k*n bits of data from the memory. As one might expect, in a preferred implementation, the step of substantially simultaneously reading the k*n bits of data comprises buffering the k*n bits of data as k words of n-bit-wide data, and may further comprise converting the n-bit-wide data into serial data to be read externally from the memory.

The method of reading data from a memory generally comprises the steps of (1) substantially simultaneously outputting k*n bits of data from the memory onto a k*n-bit-wide bus; (2) converting the k*n bits of data into n-bit-wide parallel data; and (3) converting the n-bit-wide parallel data into serial data to be read externally from the memory. In preferred aspects, the step of converting the k*n bits of data into n-bit-wide parallel data comprises buffering k words of n-bit-wide data, and the buffering step may comprise storing the k words of n-bit-wide data in k registers, each register having n data storage elements (where k and n are as described above). In other words, in the method of reading, converting k*n bits of data into n-bit-wide parallel data comprise buffering the data as k words of n-bit-wide data. In a preferred implementation, the step of converting the k*n bits of data into n-bit-wide parallel data further comprises sequentially shifting the k words of n-bit-wide data onto an n-bit-wide bus. As described above, the step of converting n-bit-wide parallel data into serial data may be conducted at a first frequency, the step of converting the k*n bits of data into n-bit-wide parallel data may be conducted at a second frequency, and the step of substantially simultaneously outputting the k*n bits of data may be conducted at a third frequency, the first, second and third frequencies being as described above.

The method of reading data from a memory may further comprise (a) identifying one of a plurality of buffer addresses for buffering the k words of the n-bit-wide data, and/or (b) identifying one of a plurality of memory addresses for simultaneously outputting the k*n bits of data from the memory.

An Exemplary Implementation

Figure 3:
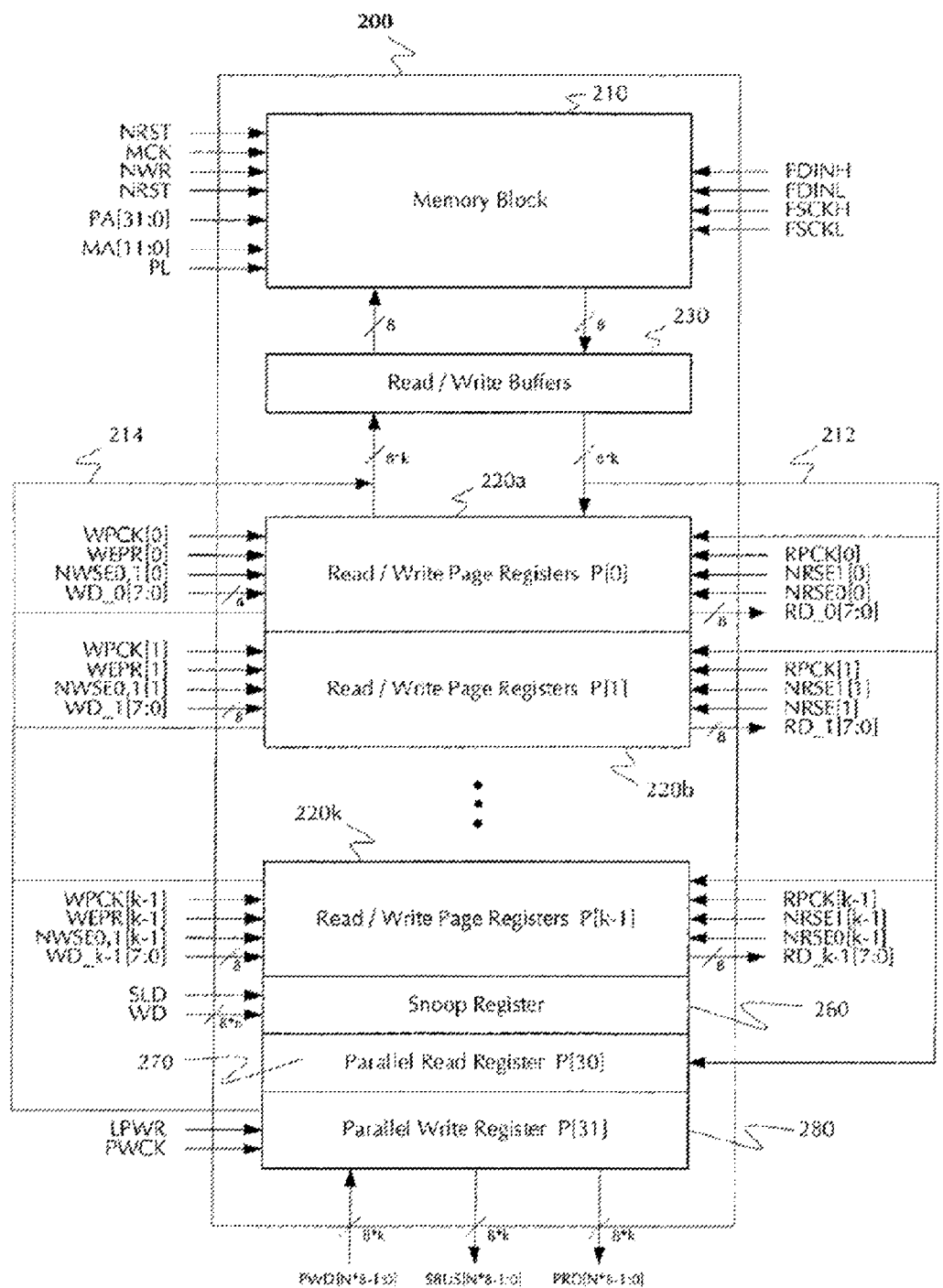
FIG. 3 is a diagram showing a preferred implementation of the present multiport memory array.

Referring now to FIG. 3, one implementation relates to a multi-port page mode memory 200. In the following implementation, multi-port page mode memory 200 comprises an expandable multi-port memory block 210 which can support any number of (and in one specific implementation, 16) write ports per block, depending on the desired application. All ports can operate concurrently, but random word accesses may not be supported. Access to memory 210 is achieved in page units 220a-220k. Each port accesses the memory through a dedicated read page and a dedicated write page. Each page is double buffered with two lines of storage which contain $2^y$ (and in one specific implementation, 32) 8-bit entries per line. The read and write port data widths are 8 bits each. Although $2^y$ 8-bit entries per line are implemented in this example, any number of entries may be present in a port buffer line, and the entries may contain any number of bits. In addition, the read and write port data widths may be any number of bits wide. Access to the memory is performed in pages of up to 32 bytes, depending on configuration. This memory allows up to the total number of ports to share up to $2^z$ (and in one specific implementation, 4096) pages in common memory block 210. Memory block 210 may have a density of from 64 kb to 64 Mb or more (e.g., from 128 kb to 32 Mb, or from 256 kb to about 16 Mb, and in one implementation, about 1 Mbit). Although a maximum page size of 32 bytes and a memory size of $2^z$ pages are implemented in this example, the maximum page size may be any number of bytes, and the memory can be any size (although it is preferred that the memory have a minimum density as described above). In addition, the read and write port data widths may be any number of bits wide. More or fewer ports can be used according to bandwidth and sustained concurrent access requirements.

This memory contains two major functional units: port pages 220a-k and memory block 210. Memory access from a port goes through a port page 220i (the designation "i" refers to any one of a plurality of substantially structurally and/or functionally identical elements), which serves as a bridge between the internal memory block interface (e.g., buffers 230) and the port interface, reconciling the difference between the memory block bandwidth and the bandwidth of an individual port while allowing efficient use of the memory block bandwidth. Since the internal memory block data interface 230 is relatively wide, and the port data interface is relatively narrow, the port pages act as temporary storage as well as parallel to serial and serial to parallel converters.

With the double buffering of port pages for both read and write accesses, the multi-port memory 200 can be used such that sustained concurrent non-blocking accesses between memory 210 and all ports can be maintained indefinitely. For port write accesses, the corresponding page entries are filled sequentially with write data through a dedicated 8-bit port write data bus. Subsequently, at the cue of a memory write signal, the entire contents of a page 220i are written into a selected page in the memory 210.

Through the memory control interface and the page control interface (not shown), the user can control when the page contents are written to the memory 210. Referring now to FIG. 4, double buffered page 220*i* shows that port write access can be directed into the second line 222 of the write buffer portion 240*i* of page 220*i* while data transfer from the first line 224 to memory 210 (not shown in FIG. 4) awaits an indication of memory availability.

Port read accesses are performed by first loading the contents from the desired page in memory 210 (up to 32 bytes) into the read buffer portion 250*i* of port page 220*i*. Next, the contents of the port page 220*i* are clocked out sequentially through the dedicated 8-bit port read bus RD[7:0]. By selecting a line using appropriate states of control signals NRSEi and multiplexer 256, the second read page line 226 is available for the next page of data from memory as soon as it is available, while the port is sending data from the first line 228. As soon as data is exhausted from the first line 228, data can be sent from the second line 226, and the first line 228 is available for the next page of data from memory 210.

The memory block 210 is accessed through memory control signals, a dedicated read bus 212 and a dedicated write bus 214 to the port pages. The width of the data busses is the number of entries 242*a-o*, 244*a-o*, 252*a-o* or 254*a-o* in a page multiplied by 8. The memory read and write busses 212 and 214 are coupled to the port read and write pages 250*i* and 240*i*, respectively. A source addresses and a destination addresses must accompany each memory request. For a write access, the source address is the port page 220*i* address, and the destination address is the page address in memory 210. For the read access, the source address is the page address in memory 210, and the destination address is the port page 220*i* address. The user controls the scheduling of the write and read operations to the port pages 220*i* and memory block 210 according to the temporal validity of the data in the port pages 220*i* and the memory block 210.

In most cases, operating in the sustained concurrent non-blocking mode will require that the number of entries 242*i*, 244*i*, 252*i* and 254*i* per page 220*i* be greater than the number of ports divided by two, and that the memory bandwidth be greater than the required aggregate bandwidth of the port pages 220*a*-220*k*.

The port count, memory capacity and memory bandwidth can be increased by using multiple blocks of the multi-port memory system described above. By cascading two multi-port page mode (MPPM) memory architectures 200 by techniques known in the art, sustained concurrent access of up to $2*2^z$ (and in one specific implementation, 8192) pages containing up to $2^y$ (and in one specific implementation, 32) bytes of data per line can be attained by up to $2*2^x$ (and in one specific implementation, 32) read and/or write (R/W) ports. Up to m MPPM memories 200 may be cascaded, enabling sustained concurrent access of up to $m*2^z$ (where z is, e.g., from 8 to 15) pages containing $2^y$ (where y is, e.g., from 3 to 8) bytes of data per line by up to $m*2^x$ (where x is, e.g., from 2 to 7) R/W ports. The exact number of ports depends on the desired aggregate port bandwidth and the memory operating frequency.

Applications of multi-port page mode memory 200 include those that can use a high port count, high bandwidth switch fabric. Features of memory 200 include support for any number of ports (e.g., in one implementation, 10, and in another, 16), dedicated read and write page blocks for each port, dedicated double buffered read port pages, dedicated double buffered write port pages, any number of entries (e.g., up to $2^y$, and in one implementation, 32) of any number of bits (e.g., up to ($2^p$+c), and in one implementation, 8) each per page line, any number of pages or memory blocks (e.g., up to $2^z$, and in one implementation, 4096), port page operational frequencies up to 200 MHz (or faster depending upon the technology used), memory block operational frequencies up to 200 MHz (or faster), a 2-cycle memory read latency, a 2-cycle memory write latency, simple interfaces, a write snoop register 260, a parallel read port register 270, and a parallel write port register 280. Hardware descriptions of the memory 200 exist or can be provided without undue experimentation in 0.13 or 0.15 μm CMOS technology. Approximate dimensions of a 1 Mb 9-port, double buffer configuration are about 1880 μm×2870 μm; approximate dimensions of a 2 Mb, 26-port, single buffer configuration are about 3800 μm×3120 μm (both estimated for 0.15 μm technology). Predicted power dissipation @ 200 MHz (page clock and memory clock frequencies) is less than 1 W.

The following name and usage conventions are used in FIGS. 3-14. Signal names start with a capital letter (for example, CLK). A signal name followed by a range enclosed in brackets represents a range of logically related signals, i.e., a bus. The first number in the range indicates the most significant bit (MSb) and the last number indicates the least significant bit (LSb). For example, RD[15:0] is a bus where RD[15] is the most significant bit ("MSb") of the RD bus. An "N" at the beginning of a signal name indicates that the signal's active state occurs when voltage is low. For example, NWR (Output enable high) is an active low signal. An underscore ("_") on RST indicates that the signal's active state occurs when voltage is low. Descriptions of the port interface signals shown in FIGS. 3-14 are provided in Table 1 below.

TABLE 1

Port interface signal descriptions.

| Width | Signal Name | Type | Description |
|---|---|---|---|
| 1 | WPCK | Input | Port write clock. A dedicated clock should accompany each write port to synchronize the loading of write data into the write page entries. A common clock can be used for all ports if timing permits and power is not a significant concern. |
| 1 | NWSE0 | Input | Write Line Select signal. When low, line 0 of write double buffer is activated. When writing to entire line, NSWE0 must be held low for 32 WPCK cycles. If both NSWE0 and NWSE1 are asserted, the same data is written to both lines. |
| 1 | NWSE1 | Input | Write Line Select signal. When low, line 1 of write double buffer is activated. When writing to entire line, NWSE1 must be held low for 32 WPCK cycles. If both NSWE0 and NWSE1 are asserted, the same data is written to both lines. |
| 1 | WEPR | Input | Write entry select pointer reset signal. This signal is used in conjunction with NWSE and is synchronized to WPCK. Assertion of WEPR relative to the rising edge of WPCK sets the selected write entry select pointer to entry 0. If both NSWE0 and NWSE1 are asserted, the write entry select pointer for both write lines is reset to entry 0. After de-assertion of WEPR, each subsequent cycle of WPCK advances the selected write entry select pointer. After the entry select pointer advances to the last entry, all subsequent WPCK cycles will produce a null pointer. The selected write pointer will point to entry 0 upon the next assertion of WEPR across the rising edge of WPCK. |
| 8 | WD[7:0] | Input | Port write 8-bit data bus. |

TABLE 1-continued

Port interface signal descriptions.

| Width | Signal Name | Type | Description |
|---|---|---|---|
| 1 | RPCK | Input | Port read clock. This clock strobes data onto the port read data bus from the read entry buffers. A dedicated clock may accompany each read port to synchronize the reading of data from the read page entries. |
| 1 | NRSE0 | Input | Read line 0 select signal. When low, line 0 of the read double buffer is activated. To shift out contents of the 32 entries, NRSE0 is asserted for 32 RPCK cycles. |
| 1 | NRSE1 | Input | Read line 1 select signal. When low, line 1 of the read double buffer is activated. To shift out contents of the 32 entries, NRSE1 is asserted for 32 RPCK cycles. |
| 8 | RD[7:0] | Output | Port read 8-bit data bus. |
| 1 | PWCK | Input | Parallel write port clock. |
| 1 | LPWR | Input | Load Parallel Write Register. Synchronous to PWCK. |
| N*8 | PRD[N*8-1:0] | Output | Read bus for the Parallel Read Port. Synchronous to MCK. |
| N*8 | PWD[N*8-1:0] | Input | Write bus for the Parallel Write Port. Synchronous to PWCK. |
| N*8 | SBUS[N*8-1:0] | Output | Read bus for the Snoop Register. Synchronous to MCK. |
| 1 | SLD | Input | Snoop Register load signal. Synchronous to MCK. |
| 1 | NRST | Input | Port logic reset signal. |
| 1 | NWR | Input | Memory write signal. Active low. Synchronous to MCK clock. When asserted, the memory performs a write-operation using source (PA) and destination (MA) addresses. The contents of the specified port page are written into the specified memory block page. |
| 1 | NRD | Input | Memory read signal. Active low. Synchronous to MCK. When asserted, the memory performs a read operation using source (MA) and destination (PA) addresses. The contents are read into the specified port page. |
| 5 | PA[4:0] | Input | Port Address. Maximum of 30 ports (for a 5-bit address). This is the source address for a write operation to main memory from a port page or the destination address for a read operation from main memory to a port page. |
| 1 | PL | Input | Specifies from which line of the double buffered page to access. "0" specifies Line 0. "1" specifies Line 1. Not used for single buffer configuration. |
| 12 | MA[11:0] | Input | Memory page address for read or write operations. Maximum of 4096 pages. This is the destination address for a port page write to memory operation and the source address for memory page to port page read. |

Descriptions of the memory interface signals shown in FIGS. 3-14 are provided in Table 2 below.

TABLE 2

Memory interface signal descriptions.

| Width | Signal Name | Type | Description |
|---|---|---|---|
| 1 | MCK | Input | MCK is the clock for the memory block. Can be asynchronous to PCK. All memory block operations are synchronized to MCK. |
| 1 | FDINH | Input | Redundancy information from fuse block for memory sub-block H, loaded through this port after system reset. |
| 1 | FDINL | Input | Redundancy information from fuse block for memory sub-block L, loaded through this port after system reset. |
| 1 | FSCKH | Input | Clock from fuse block to latch data in from FDINH. |
| 1 | FSCKL | Input | Clock from fuse block to latch data in from FDINL. |
| 2 (or more) | WTC | Input | Code for setting internal write timing margin. May be input into programmable register. |
| 3 (or more) | RTC | Input | Code for setting internal read timing margin. May be input into programmable register. |

Functional Description

Figure 5:
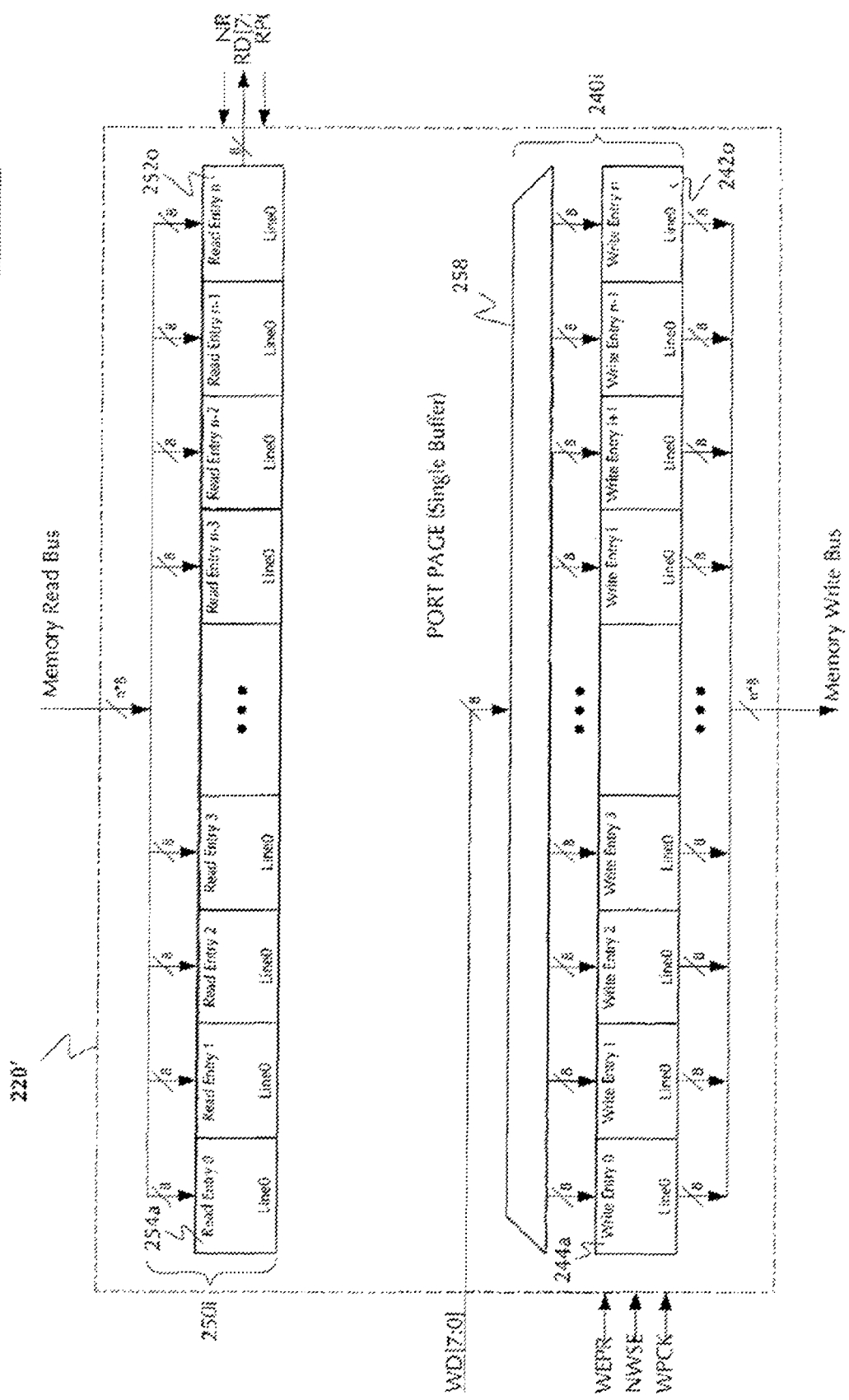
FIG. 5 is a block diagram of an exemplary single buffered port buffer.

Referring to FIG. 3, each port 220i contains a dedicated read bus 212 and a dedicated write bus 214. Read and write activities can therefore occur concurrently through each port 220i. The port interface contains an 8-bit read bus (RD), an 8-bit write bus (WD), write port clock (WPCK), read port clock (RPCK), write entry pointer reset (WEPR), write double buffer line selector (NWSE), and read double buffer line selector (NRSE) for each line. Either or both of the port clocks may be synchronized to a dedicated or general/universal port reference clock (e.g., signal ref pck in FIGS. 6-9). A detailed block diagram of the double buffered read and write port page 220i is shown in FIG. 4. For a system using two or more banks of MPPM, the port pages need not be double buffered. Double buffering results from the fact that each single buffer from multiple banks can be combined to perform one or more multi-buffering functions. FIG. 5 shows a block diagram of the single buffered port page 220', which is similar to the double buffered page, but in which each of the read and write buffer portions 250 and 240 respectively includes a single line of entries 252i and 242i, and in which the read portion does not include a multiplexer 256.

Figure 6:
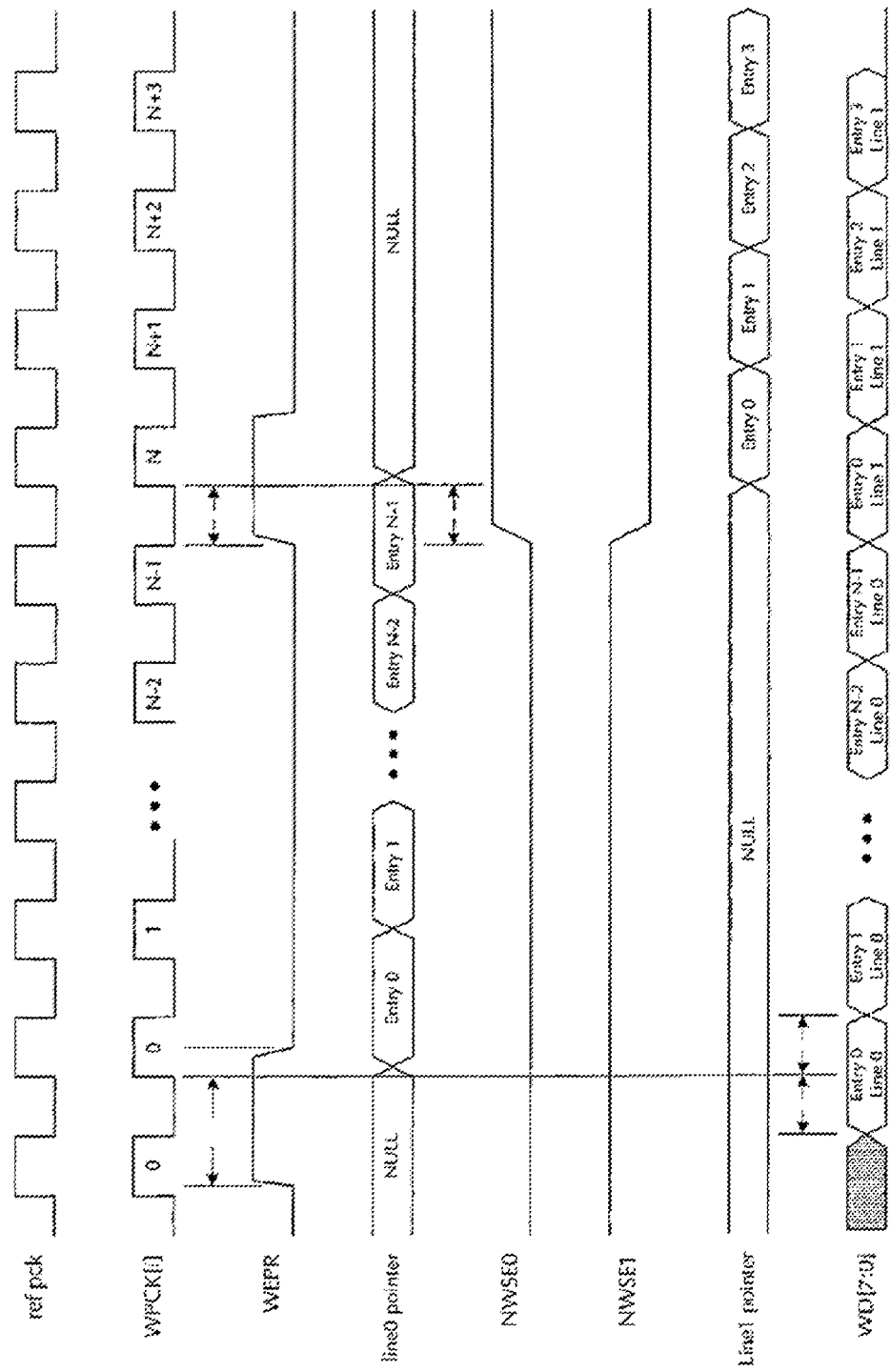
FIG. 6 is a timing diagram for an exemplary port buffer write operation according to one or more aspects.

Referring back to FIG. 4, each line in a page 220 contains n 8-bit entries. Access to the write entries in a line is done sequentially using an access pointer. This access pointer is activated using the respective write line select signal NWSE. Referring now to FIG. 6, asserting the selected entry pointer reset signal WEPR at the rising edge of the port clock (WPCK for the write line, which may be the same as, complementary to, or an integer multiple and/or fraction of a reference clock, ref pck) resets the entry pointer to select entry 0, which latches the 8 bits of data on WD[0:7] into line 0 (NWSE0 is in an active low state). The next (n−1) clocks sequentially advance the selected pointer to entry N, latching the data on WD[0:7] into each consecutive line entry on each successive clock. Also after (n−1) clock cycles, NWSE1 may transition to an active low state, while NWSE0 transitions to an inactive high state. Any additional port clock WPCK cycles cause the entry pointer to select none of the entries in line 0 (a null pointer), and the line 0 entry pointer will stay in a null state until reset signal WEPR is asserted again to set it to select entry 0. WEPR may be timed (e.g., using a counter circuit) to be active for 1 clock cycle every n clock cycles. After asserting WEPR and NWSE1, data is written into consecutive line 1 entries in the same fashion as for line 0. For power conservation, NWSE should be de-asserted when the port is not active.

Figure 7:
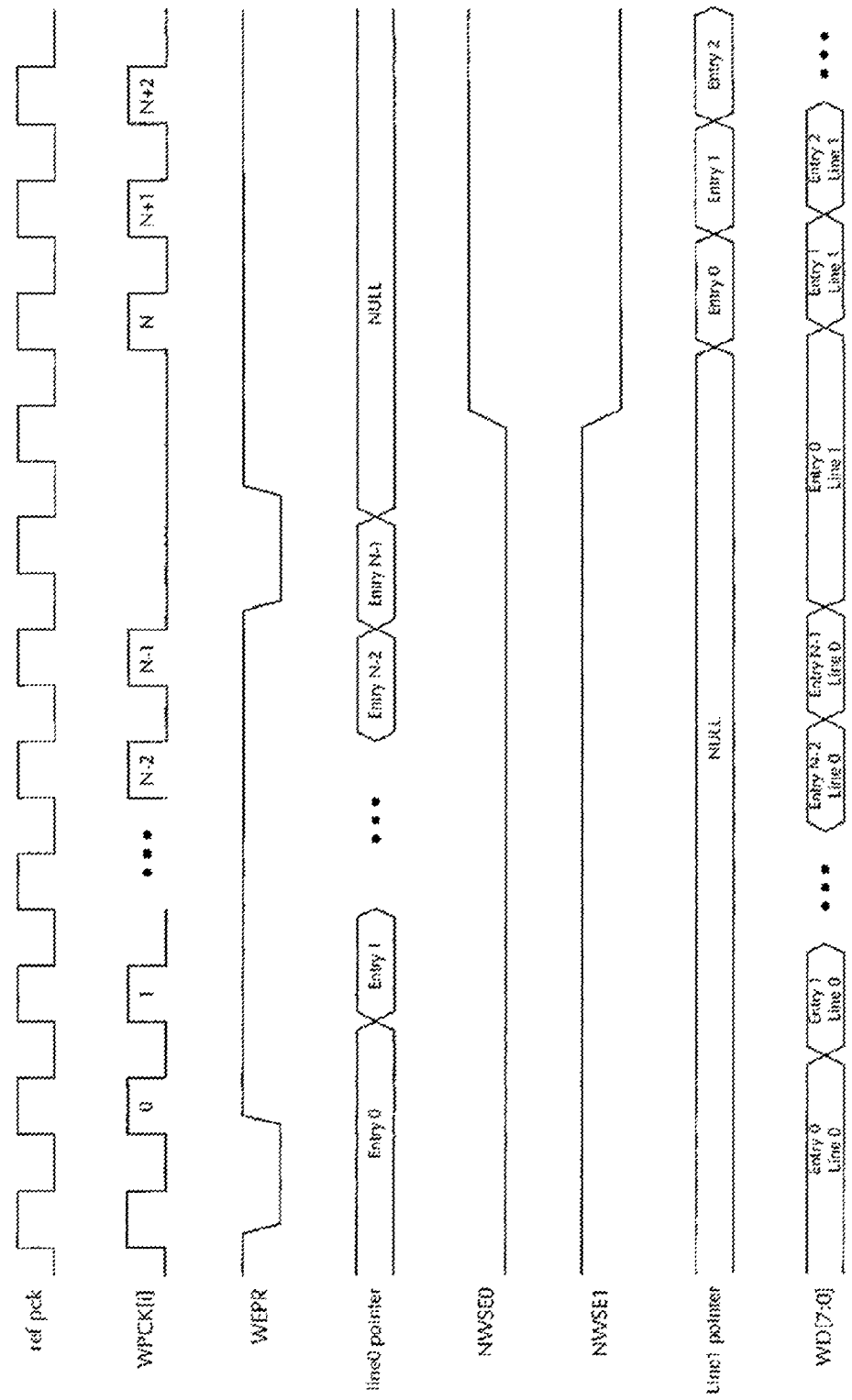
FIG. 7 is a timing diagram for a second exemplary port buffer write operation according to one or more aspects.

While FIG. 6 shows write line select signals NWSE0 and NWSE1 in a complementary arrangement, these signals need not change state at the same time. For example, there may be some time period between deassertion of NWSE0 and assertion of NWSE1, particularly in the case where both lines need not be written consecutively. FIG. 7 shows yet another case where NWSE0 and NWSE1 change states in a complementary manner, but some length of time after (n−1) WPCK cycles. For example, activating transitions of WEPR and NWSE may be offset by one or more clock cycles, to ensure timing and/or to avoid potential data loss. In such a case, WEPR may be asserted across both a rising and falling transition of WPCK before NWSE changes state.

Figure 8:
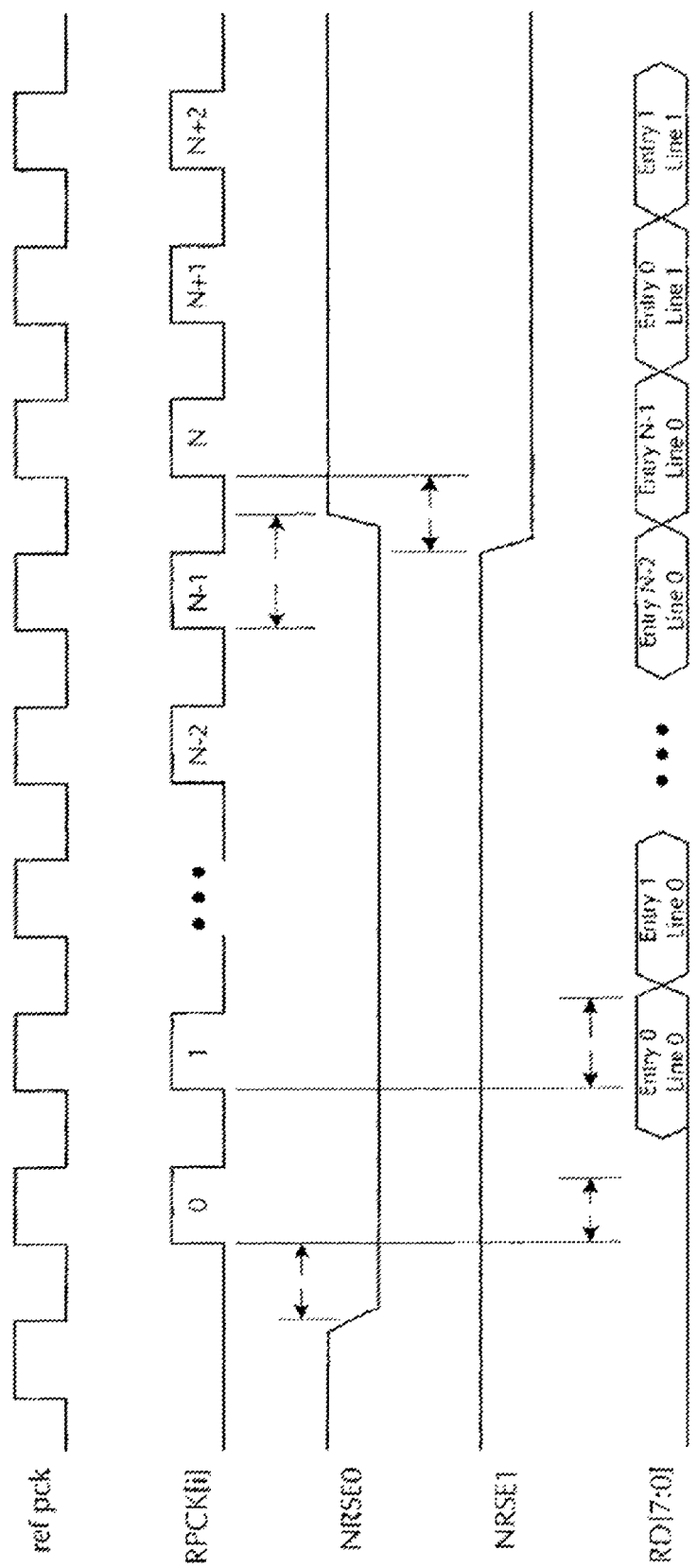
FIG. 8 is a timing diagram for an exemplary port buffer read operation according to one or more aspects.

Referring now to FIG. 8, access to the read line entries is performed sequentially using cascaded flip-flops. Shifting of data through the read line is activated using the respective read line select signal NRSE. FIG. 8 shows the sequence of RPCK, NRSE0 and NRSE1 signals to read entry data from the two page lines in a double buffered port buffer (see, e.g., read page configuration 250$i$ in FIG. 4).

As shown in part in FIG. 8, simply asserting NRSE0 latches the n*8 bits of data on the memory read bus into the n entries of line 0, port 220$i$, on the next rising edge of the port read clock RPCK (cycle 0). The next (n−1) read clocks sequentially shift out the n entries from line 228 (see FIG. 4) onto RD[0:7]. There is no need to reset the entry pointer to entry 0, which is the selected entry when pointer reset signal WEPR is asserted, as the structure of the read buffer lines 226 and 228 (e.g., a conventional shift register) automatically outputs the data from successive entries on successive rising clock transitions. Also after (n−1) clock cycles, NRSE1 may transition to an active low state, while NRSE0 transitions to an inactive high state. If NRSE1 does not transition to an active state, additional RPCK cycles read a high-impedance or null state from line 0 until a reset signal such as one of the NRSE signals (preferably NRSE1) is asserted to begin another read operation from port 220$i$. NRSE signals may be timed (e.g., using a counter circuit) to be active for 32 consecutive clock cycles whenever activated by an appropriate (and generally externally generated) read instruction. After asserting NRSE1 (which may also before NRSE0 transitions high, any time after the immediately preceding rising RPCK edge on cycle N−1), n*8 bits of data is written into the n line 1 entries in the same fashion as for line 0. For power conservation, NRSE should be de-asserted when the port is not active. Similarly, for power conservation in the write case, NWSE should be de-asserted when a port is not active.

Memory Interface

Referring back to FIG. 3, the memory interface is configured to control data transfer between the internal memory block 210 and port pages 220$a$-$k$. The interface includes a dedicated read and dedicated write bus. Memory read and memory write commands are sampled at the rising edge of the memory clock, MCK, and are generally accompanied by source and destination addresses and page line number (when an addressed port page is in a double buffer configuration). Valid memory interface commands include read, write, and no-op (when neither read nor write is asserted). For writing from a port page 220$i$ to a page in memory 210, the source address, driven on the PA bus, is the port address and the destination address, driven on the MA bus, is the memory page address. For reading from a page in memory 210 to a port page 220$i$, the source address, driven on MA, is the memory page address, and the destination address, driven on PA, is the port page address. A memory command can be accepted every MCK cycle.

Writing to Memory

Loading of all entries in a write page must be tracked. This may be done automatically using conventional logic (e.g., an n-bit counter that is reset in response to an appropriate transition or combination of WEPR and/or NWSE). Once all entries in a port page are loaded, the entire contents of this page are written into memory 210 by asserting NWR, de-asserting NRD and specifying the appropriate source and destination addresses. Referring to FIG. 4, to ensure that data in the last entry 242$o$ or 244$o$ in the write page line 224 or 222 is written with an associated write to memory, the minimum time between the rising edge of the page clock (PCK) which loads the last entry 242$o$/244$o$ to the rising edge of MCK which samples the write command must be at least 0 ns, preferably more than 0 ns. There are generally two MCK cycles of latency between the write command and when the data is actually written into memory.

Referring back to FIG. 3, a snoop buffer 260 is configured to capture data to be written into memory 210 in one MCK cycle. The snoop buffer 260 is activated by asserting SLD during a memory write command. Data from all N entries to be written to memory 210 also will be written into the snoop buffer and driven onto the N*8-bit wide snoop bus.

Figure 9:
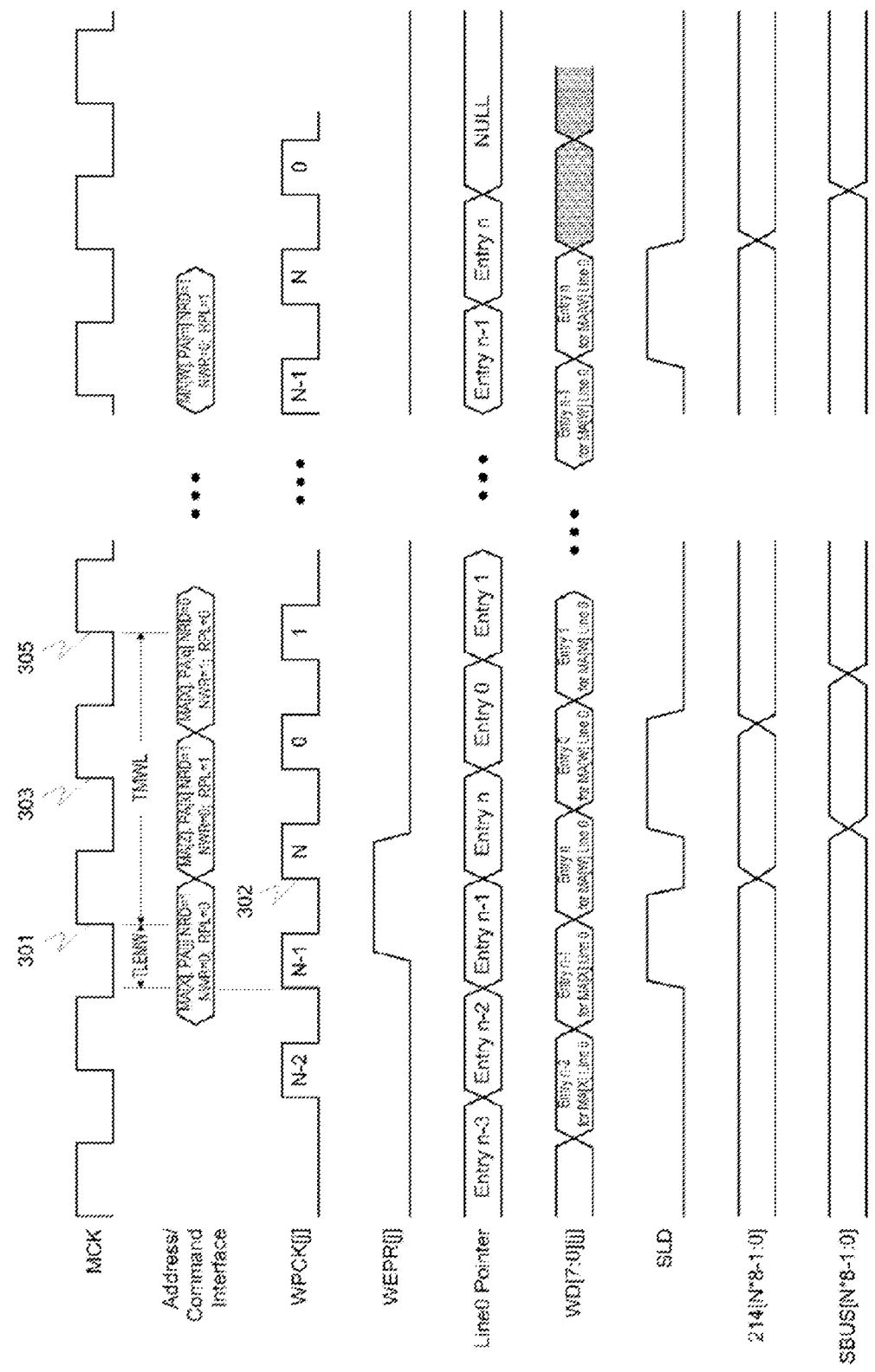
FIG. 9 is a timing diagram for an exemplary memory block write operation according to one or more aspects.

FIG. 9 is a timing diagram showing writing of data from port page 240$j$ to a page in memory block 210 with the associated timing constraints. Various states of memory interface signals triggering certain write events are shown in the second waveform from the top of FIG. 9. On MCK edge 301, data from port 240$j$, line 0, is written to memory 210, page address X. The rising edge 302 of port clock WPCK[j], writing data into the last entry 244$o$ in write page 224$j$, must occur a period of time at least TLEMW before MCK edge 301. TLEMW is the time between the clock for the last written entry and the memory command clock for an associated write to memory block 210. TLEMW is at least 0 ns, preferably more than 0 ns, more preferably at least 1 ns.

On MCK edge 303, data from port 240$k$, line 1, is written to memory 210, page address Z. As for port clock WPCK[j], the rising edge of port clock WPCK[k] writing data into the last entry in write page 224$k$, must occur a period of time at least TLEMW before MCK edge 303. Data from port 240$j$, line 0, is latched in snoop register 260 on MCK edge 303.

On MCK edge 305, data from port 240$q$, line 0, is written to memory 210, page address X. Thus, the present architecture allows for data in memory 210 to be overwritten as soon as two clock cycles after a first block or page of data is written. Data from port 240$k$, line 1, is latched in snoop register 260 on MCK edge 305.

The MPPM block 200 may also include a page 280 with N*8 parallel inputs, PWD[N*8-1:0], and N*8 parallel outputs to the memory write bus 214. When present, the parallel write port page register 280 may have a port address of 31. The contents of this register may be written to memory 210 using the memory write command with the parallel write port 280 as the source address and with a page in the memory 210 as the destination address.

Reading from Memory

Figure 10:
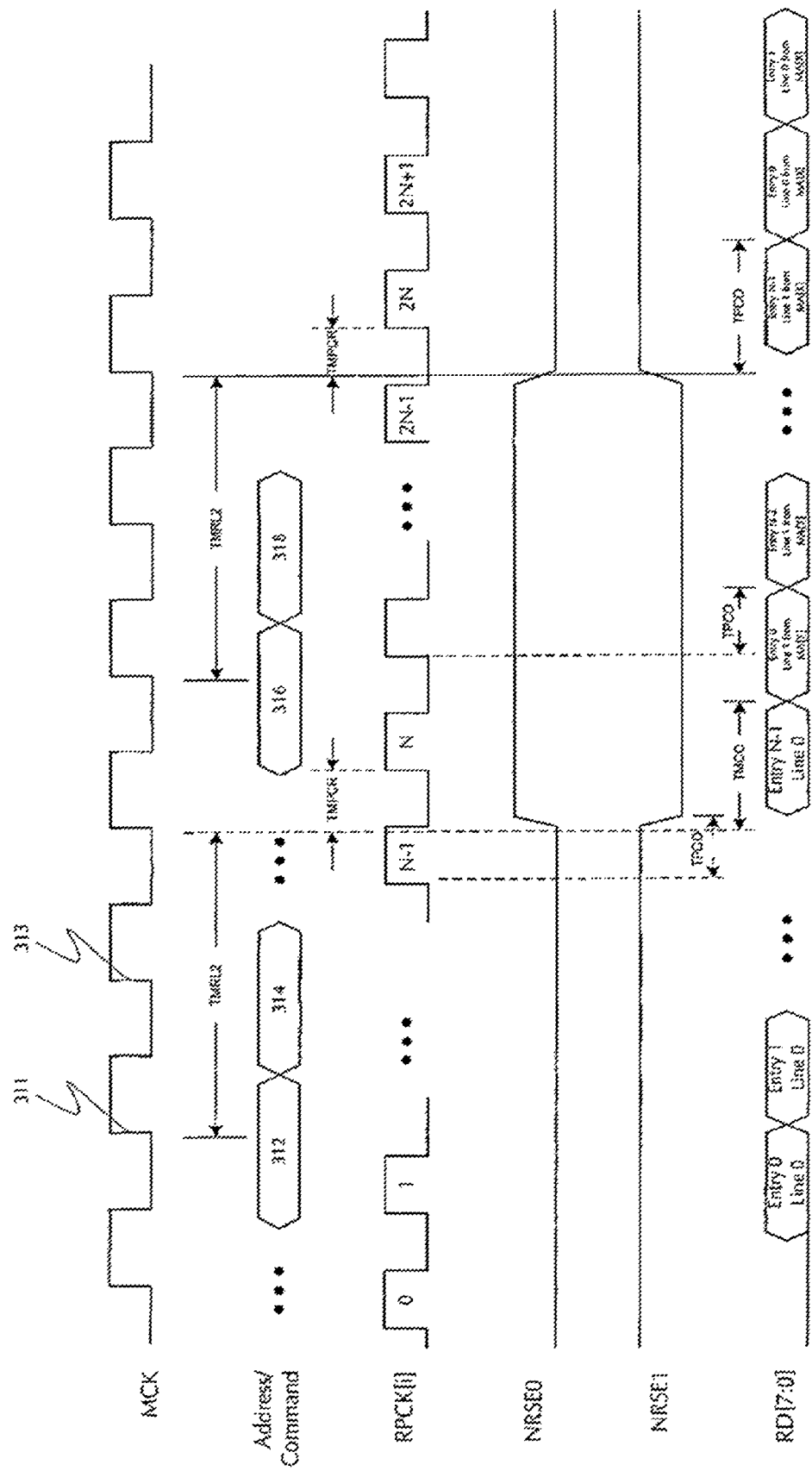
FIG. 10 is a timing diagram for an exemplary memory block read operation according to one or more aspects.

Referring now to FIG. 10, to read from a page in memory 210 to a port page 220$i$, a read command (NRD=0, NWR=1) is sent to MPPM 200 along with a memory page address (MA), a port page address (PA) and line number (if port page 220$i$ is double buffered). As shown in FIG. 10, there is a latency of two MCK cycles (TMRL2) plus TMCO (the time from the end of a 2-cycle latency to the next rising transition of MCK) before the data from memory 210 is loaded into the port page 220$i$. Data can be read from the port page two or three MCK cycles after the memory read command. While FIG. 10 shows a case where there is a latency of 2 or 3, latency depends on a number of factors, such as memory operating frequency, register operating frequency, port operating frequency, process technology (e.g., wire resistivities), layout (e.g., length of data transfer wires), etc. Thus, it is entirely feasible that, under appropriate design and process technology conditions, one cycle of latency is sufficient, and under others, more than three cycles may be desirable.

Figure 11:
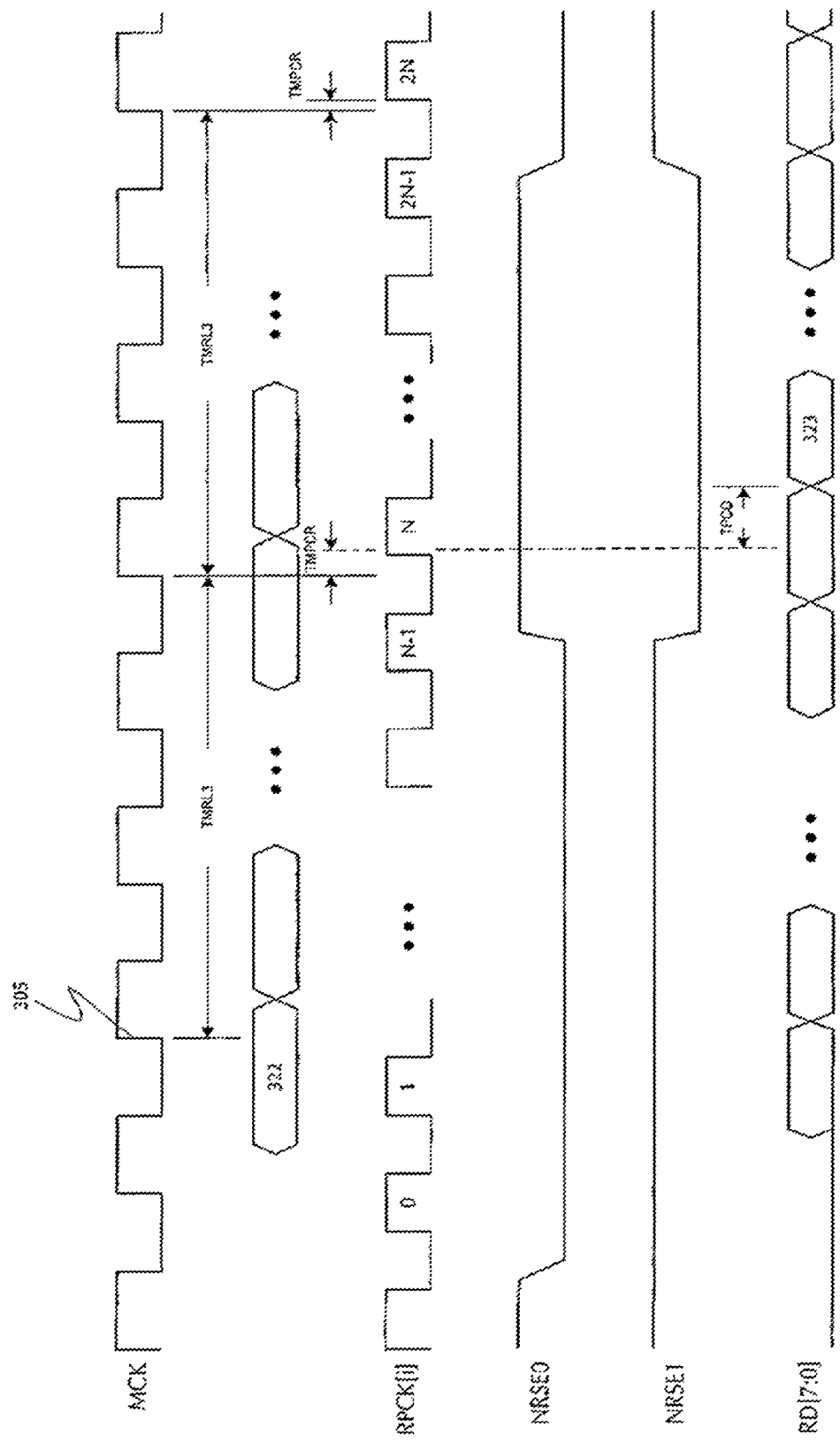
FIG. 11 is a timing diagram for a second exemplary memory block read operation according to one or more aspects.

FIGS. 10-12 show the interleaving of memory read commands and port line (address) selection to obtain continuous data streaming from a read portion 250j of double buffered port page 220j. To ensure adequate read timing two MCK cycles after the memory read command, NRSE is asserted and the read data begins shifting out three MCK cycles after the memory read command. For example, there may be some TPCO timing penalty (i.e., from rising edge of RPCK to valid RD) when shifting out data from a read line only two MCK cycles from a corresponding memory read command.

FIG. 10 shows the case where the latency of reading from memory 210 to port 220j is 2 cycles. At MCK edge 311, data from memory 210, page X is read into port 220j, line 1, since the commands and signals 312 on the address/command interface waveform have the values MA[X], PA[j], NRD=0, NWR=1 and RPL=1. As shown in the RD waveform at the bottom of FIG. 10, data from port 220j, line 1, is read out of the architecture/device 200 2 MCK cycles plus TMCO after MCK edge 311. At MCK edge 313, data from memory 210, page Z is read into port 220q, line 1, since the commands and signals 314 on the address/command interface waveform have the values MA[Z], PA[q], NRD=0, NWR=1 and RPL=1. In this implementation, the read latency from assertion of memory read command NRD to port page line output on RD[7:0] can be as low as 2 MCK cycles plus TMCO when RPCK is the same as MCK. Data can be driven from the port read line 226/228 2 cycles after the appropriate NRD edge. The rising RPCK[x] edge clocking or latching an entry read after NRSE assertion should be not less than TMPCR (the time from the end of TMRL2 to the next rising edge of RPCK[x], which must be at least 0 ns, preferably more than 0 ns) plus TMRL2 from the associated NRD edge.

FIG. 11 shows the case where the latency of reading from memory 210 to port 220i is 3 MCK cycles. At MCK edge 321, data from memory 210, page X is read into port 220j, line 1, since the commands and signals 322 on the address/command interface waveform have the values MA[X], PA[j], NRD=0, NWR=1 and RPL=1. As shown in the RD waveform at the bottom of FIG. 11, data 323 from port 220j, line 1, is read out of the architecture/device 200 3 MCK cycles plus TMCO after MCK edge 321. The rising RPCK[x] edge clocking or latching an entry read after NRSE assertion can be TMPCR (as defined above) plus TMRL3 (3 MCK cycles) or more from the associated NRD edge. The "latency of 3" case is preferred when RPCK is not the same as MCK, under the manufacturing process technology and timing constraints in this exemplary implementation. A different number of cycles of latency may be applied under different processing and/or timing conditions.

Referring back to FIG. 3, the MPPM block 200 may also include a page 270 with a (N*8)-bit parallel input driven by the N*8-bit memory read bus 214 and a N*8 parallel output bus driving PRD[N*8-1:0]. When present, parallel read port page register 270 may assume a port address of 30. The PRD bus contents can be updated with contents of a memory page by using the parallel read port 270 address as the destination in a memory read command.

Referring now to FIG. 12, at MCK edge 331, data may be written from parallel write port 280 to memory 210, page X, since the commands and signals 332 on the address/command interface waveform have the values MA[X], PA[31], NRD=1 and NWR=0. As shown in the PWD waveform of FIG. 12, data from parallel write port 280 is valid for a period of time (TLPWDS+TLPWDH), or the parallel write register (PWD) set up and hold time. Typically, TLPWDS (the PWD set up time) is from 0 ns to 2 ns (e.g., between 0 and about 1 ns, and in one implementation, about 0.3 ns) before a rising edge of PWCK, and TLPWDH (the PWD hold time) is from 0.5 ns to 4 ns (e.g., from 0.5 ns to 2 ns, and in one implementation, about 1.2 ns) after the rising edge of PWCK. At MCK edge 333, data may be read from memory 210, page Z, into parallel read port 270 since the commands and signals 334 on the address/command interface waveform have the values MA[Z], PA[30], NRD=0 and NWR=1. As for the memory read operations described above, data 337 from MA[Z] is read onto parallel read port bus PRD two MCK cycles plus a period of time TPRDO (i.e., MCK edge to parallel read port data PRD valid) after the corresponding read command edge 333.

At MCK edge 335, data is read from memory 210, page X, into port buffer 220q, line 0 in accordance with the memory read operations described above, since the commands and signals 336 on the address/command interface waveform have the values MA[X], PA[q], NRD=0, NWR=1 and RPL=0. As for data 337 from MA[Z] is read onto parallel read port bus PRD two MCK cycles plus a period of time TPRDO after the corresponding read command edge 333. The commands and signals 338 on the address/command interface waveform have the values MA[Y], PA[30], NRD=0 and NWR=1. Therefore, at MCK edge 339, data is read from memory 210, page Y, into parallel read port 270. This data 338 is read onto parallel read port bus PRD two MCK cycles plus a period of time TPRDO after the corresponding read command edge 339.

Although the subject matter has been described in language specific to structural features and/or methodological operations, the subject matter defined in the appended claims is not necessarily limited to the specific features or operations described above, including orders in which the features or operations are shown and/or performed

The invention claimed is:
1. An integrated-circuit comprising:
   a memory array configured as a multiport memory having an interface to a write bus from which parallel data is received and an interface to a read bus to which parallel data is transmitted;
   a data port interface from which serial data is received from a data port and to which serial data is transmitted to the data port;
   a multiline port buffer configured to buffer data communicated between the memory array and the data port interface, each line of the multiline port buffer configured to buffer k words of data and operably coupled to the write bus, the multiline port buffer configured to:
      receive the serial data from the data port via the data port interface;
      convert, at a first frequency, the serial data received from the data port interface to n-bit-wide words of parallel data;
      buffer, at a second frequency, a k-word-long block of the n-bit-wide words of parallel data into one of the lines of the multiline port buffer as a block of k*n bits of data by sequentially writing k words of the n-bit-wide words of parallel data into k data storage elements of the line of the multiline port buffer; and transmit, at a third frequency, the block of k*n bits of data to the memory array via the write bus effective to write the block of k*n bits of data to the memory array, the third frequency different than the first frequency.

2. The integrated-circuit of claim 1, wherein the multiline port buffer is further configured to identify one of a plurality of memory addresses for the step of transmitting the block of k*n bits of data to the memory array.

3. The integrated-circuit of claim 1, wherein the multiline port buffer is further configured to receive a selection of the one line of the multiline port buffer into which the k-word-long block of the n-bit-wide words of parallel data is buffered.

4. The integrated-circuit of claim 1, wherein the third frequency is equal to or higher than the second frequency.

5. The integrated-circuit of claim 1, wherein the memory array is further configured as a multi-port page mode (MPPM) memory.

6. An integrated-circuit comprising:
a memory array configured as a multiport memory having an interface to a write bus from which parallel data is received and an interface to a read bus to which parallel data is transmitted;
a data port interface from which serial data is received from a data port and to which serial data is transmitted to the data port;
a multiline port buffer configured to buffer data communicated between the memory array and the data port interface, each line of the multiline port buffer configured to buffer k words of data and operably coupled to the read bus, the multiline port buffer configured to:
receive, at a first frequency, a block of k*n bits of data from the memory array via the read bus, the read bus having a width of k*n bits;
buffer, at a second frequency, the block of k*n bits of data into one of the lines of the multiline port buffer as k words of n-bit-wide parallel data by buffering k words of n-bit-wide parallel data in k entries of the line of the multiline port buffer, each entry having n data storage elements;
convert, at a third frequency, the k words of n-bit-wide parallel data into serial data acceptable to the data port, the third frequency different than the first frequency; and
transmit the serial data to the data port via the data port interface effective to enable the serial data to be read from the memory array.

7. The integrated-circuit of claim 6, wherein the multiline port buffer is further configured to buffer the block of k*n bits of data by sequentially shifting the k words of the n-bit-wide parallel data onto an n-bit-wide bus.

8. The integrated-circuit of claim 6, wherein the multiline port buffer is further configured to identify one of a plurality of memory addresses from which the block of k*n bits of data is received from the memory array.

9. The integrated-circuit of claim 6, wherein the multiline port buffer is further configured to receive a selection of the one line of the multiline port buffer into which the block of k*n bits of data is buffered.

10. The integrated-circuit of claim 6, wherein the third frequency is equal to or higher than the second frequency.

11. The integrated-circuit of claim 6, wherein the memory array is further configured as a multi-port page mode (MPPM) memory.

12. A multiport network switch comprising:
a multiport memory operably coupled with a write bus from which parallel data is received and with a read bus to which parallel data is transmitted;
two or more data ports from which network data is received and to which network data is transmitted;
two or more multiline port buffers, each of the multiline port buffers configured to buffer data communicated between the memory array and a respective data port, having multiple lines configured to buffer k words of data, operably coupled to the write bus associated with the multiport memory, and configured to:
receive network data from the respective data port as serial data;
convert, at a first frequency, the serial data received from the respective data port to n-bit-wide words of parallel data;
buffer, at a second frequency, a k-word-long block of the n-bit-wide words of parallel data into one of the multiple lines of the multiline port buffer as a block of k*n bits of data by buffering k words of n-bit-wide parallel data in k entries of the line of the multiline port buffer, each entry having n data storage elements; and
transmit, at a third frequency, the block of k*n bits of data to the multiport memory via the write bus effective to write the block of k*n bits of data to the multiport memory, the third frequency different than the first frequency.

13. The multiport network switch of claim 12, wherein each of the multiline port buffers is further configured to buffer the block of k*n bits of data by sequentially shifting the k words of the n-bit-wide parallel data onto an n-bit-wide bus.

14. The multiport network switch of claim 12, wherein the two or more multiline port buffers are triple-buffered and the multiple lines of each of the multiline port buffers include three write lines and three read lines.

15. The multiport network switch of claim 12, wherein the two or more multiline port buffers are double-buffered and the multiple lines of each of the multiline port buffers include two read lines and two write lines.

* * * * *